(12) United States Patent
Shirako et al.

(10) Patent No.: US 10,590,531 B1
(45) Date of Patent: Mar. 17, 2020

(54) SUBSTRATE PROCESSING APPARATUS, AND METHOD OF MANUFACTURING SEMICONDUCTOR DEVICE

(71) Applicant: KOKUSAI ELECTRIC CORPORATION, Tokyo (JP)

(72) Inventors: Kenji Shirako, Toyama (JP); Tomoshi Taniyama, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/555,755

(22) Filed: Aug. 29, 2019

(30) Foreign Application Priority Data

Sep. 4, 2018 (JP) .................................. 2018-165213

(51) Int. Cl.
| | |
|---|---|
| H01L 21/67 | (2006.01) |
| C23C 16/44 | (2006.01) |
| C23C 16/52 | (2006.01) |
| H01L 21/673 | (2006.01) |

(52) U.S. Cl.
CPC .......... *C23C 16/4412* (2013.01); *C23C 16/52* (2013.01); *H01L 21/67161* (2013.01); *H01L 21/67303* (2013.01)

(58) Field of Classification Search
CPC ................ C23C 16/4412; C23C 16/52; H01L 21/67161; H01L 21/67303
USPC ....................................................... 438/758
See application file for complete search history.

(56) References Cited

U.S. PATENT DOCUMENTS

| | | | |
|---|---|---|---|
| 6,053,980 A | 4/2000 | Suda et al. | |
| 6,902,624 B2 | 6/2005 | Seidel et al. | |
| 2003/0213560 A1* | 11/2003 | Wang | ..................... C23C 14/566 156/345.31 |
| 2006/0090849 A1 | 5/2006 | Toyoda et al. | |
| 2011/0218659 A1* | 9/2011 | Nomura | ............... G05B 19/418 700/96 |
| 2011/0265884 A1* | 11/2011 | Xu | ..................... H01L 21/67017 137/14 |

(Continued)

FOREIGN PATENT DOCUMENTS

| | | |
|---|---|---|
| JP | 2016-009724 A | 1/2016 |
| WO | 2018/003072 A1 | 1/2019 |

*Primary Examiner* — Sheikh Maruf
(74) *Attorney, Agent, or Firm* — Volpe and Koenig, P.C.

(57) ABSTRACT

There is provided a technique that includes: a first processing module including a first processing chamber for processing vertically arranged substrates; a second processing module including a second processing chamber for processing the substrates, the second processing chamber disposed adjacent to the first processing chamber; a first exhaust box storing a first exhaust system exhausting the first processing chamber; a second exhaust box storing a second exhaust system exhausting the second processing chamber; a common supply box controlling at least one of a flow path and a flow rate of process gases supplied into the first and second processing chambers; a first valve group connecting gas pipes from the common supply box to the first processing chamber such that a communication state is controllable; and a second valve group connecting the gas pipes from the common supply box to the second processing chamber such that a communication state is controllable.

10 Claims, 12 Drawing Sheets

(56) References Cited

U.S. PATENT DOCUMENTS

| | | | | |
|---|---|---|---|---|
| 2011/0265951 A1* | 11/2011 | Xu | ................... | C23C 16/45561 |
| | | | | 156/345.26 |
| 2011/0266256 A1* | 11/2011 | Cruse | ................ | H01J 37/32899 |
| | | | | 216/59 |
| 2012/0046774 A1* | 2/2012 | Nakamura | ........ | H01L 21/67017 |
| | | | | 700/100 |
| 2015/0093913 A1* | 4/2015 | Toyoda | ............. | C23C 16/45557 |
| | | | | 438/769 |
| 2015/0267297 A1* | 9/2015 | Shiba | ................... | C23C 16/401 |
| | | | | 427/569 |
| 2015/0303079 A1* | 10/2015 | Oosterlaken | ........ | H01L 21/6719 |
| | | | | 432/258 |
| 2017/0110349 A1* | 4/2017 | Fujino | ..................... | C23C 16/54 |
| 2018/0304286 A1* | 10/2018 | Ishii | ..................... | B05B 7/0433 |
| 2018/0315585 A1* | 11/2018 | Gomi | ................ | H01L 21/67173 |
| 2018/0342409 A1* | 11/2018 | Shindo | .............. | H01L 21/67196 |
| 2019/0198359 A1 | 6/2019 | Kamimura et al. | | |

* cited by examiner

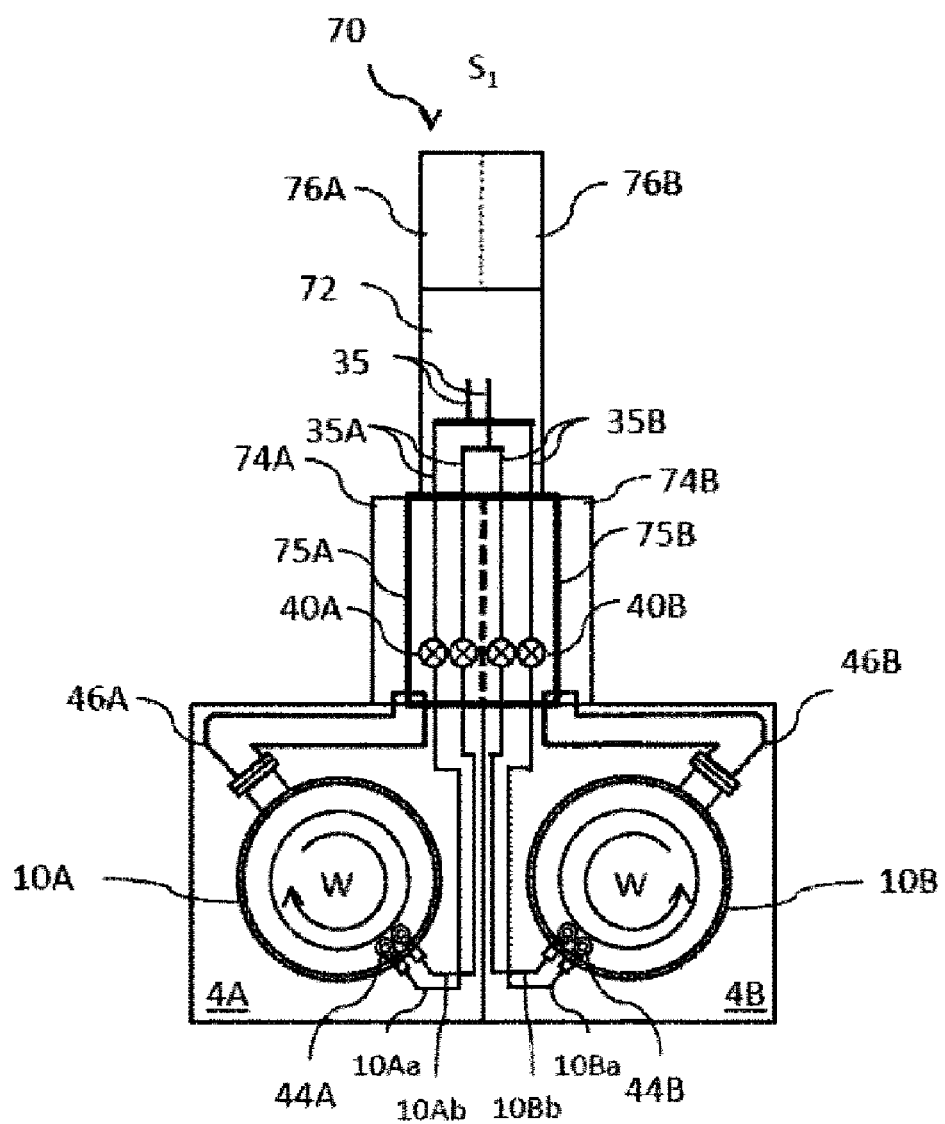

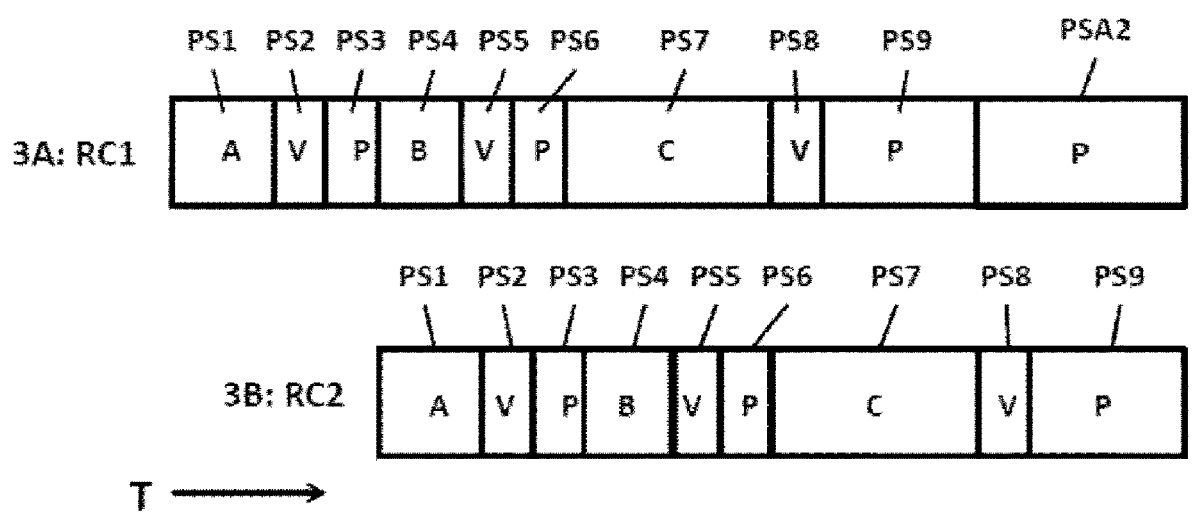

SUBSTRATE PROCESSING APPARATUS, AND METHOD OF MANUFACTURING SEMICONDUCTOR DEVICE

CROSS-REFERENCE TO RELATED APPLICATION

This application is based upon and claims the benefit of priority from Japanese Patent Application No. 2018-165213, filed on Sep. 4, 2018, the entire contents of which are incorporated herein by reference.

TECHNICAL FIELD

The present disclosure relates to a substrate processing apparatus, and a method of manufacturing a semiconductor device.

BACKGROUND

A substrate processing apparatus includes a processing module having a process furnace that processes a plurality of vertically arranged substrates. As such a type of substrate processing apparatus, a substrate processing apparatus including a plurality of processing modules has been proposed in the related art.

In a substrate processing apparatus including a first processing module and a second processing module, when the same film is formed on a substrate by each of the processing modules, qualities of the films formed by the plurality of processing modules may differ from each other.

SUMMARY

Some embodiments of the present disclosure provide a technique capable of obtaining uniform qualities for films formed by first and second processing modules when forming the same film in the first and second processing modules.

Other objects and novel features will be apparent from the description of the present disclosure and the accompanying drawings.

A summary of a representative embodiment of the present disclosure is simply described as shown below.

According to one embodiment of the present disclosure, there is provided a technique including: a first processing module including a first processing chamber for processing a plurality of vertically arranged substrates; a second processing module including a second processing chamber for processing the plurality of vertically arranged substrates, the second processing chamber being disposed adjacent to the first processing chamber; a first exhaust box storing a first exhaust system configured to exhaust the first processing chamber; a second exhaust box storing a second exhaust system configured to exhaust the second processing chamber; a common supply box configured to control at least one of a flow path and a flow rate of a plurality of process gases supplied into the first and second processing chambers; a first valve group that connects gas pipes from the common supply box to the first processing chamber such that a communication state between the gas pipes and the first processing chamber is controllable; and a second valve group that connects the gas pipes from the common supply box to the second processing chamber such that a communication state between the gas pipes and the second processing chamber is controllable, wherein, in the first processing module and the second processing module, processes of repeating substantially the same gas supply sequence are performed in parallel with each other while having a shift time therebetween so as to form the same film, and wherein the shift time is determined by delaying the gas supply sequence of one of the first processing module and the second processing module so that a supply timing of a predetermined gas among the plurality of process gases does not overlap with the gas supply sequence of the other of the first processing module and the second processing module which has started the processing before the one of the first processing module and the second processing module starts the processing.

BRIEF DESCRIPTION OF DRAWINGS

FIG. 5 is a cross-sectional view schematically showing an example of a processing module suitably used in an embodiment of the present disclosure.

FIG. 6C is a view for explaining an example of control of a recipe by a controller.

DETAILED DESCRIPTION

Figure 1:
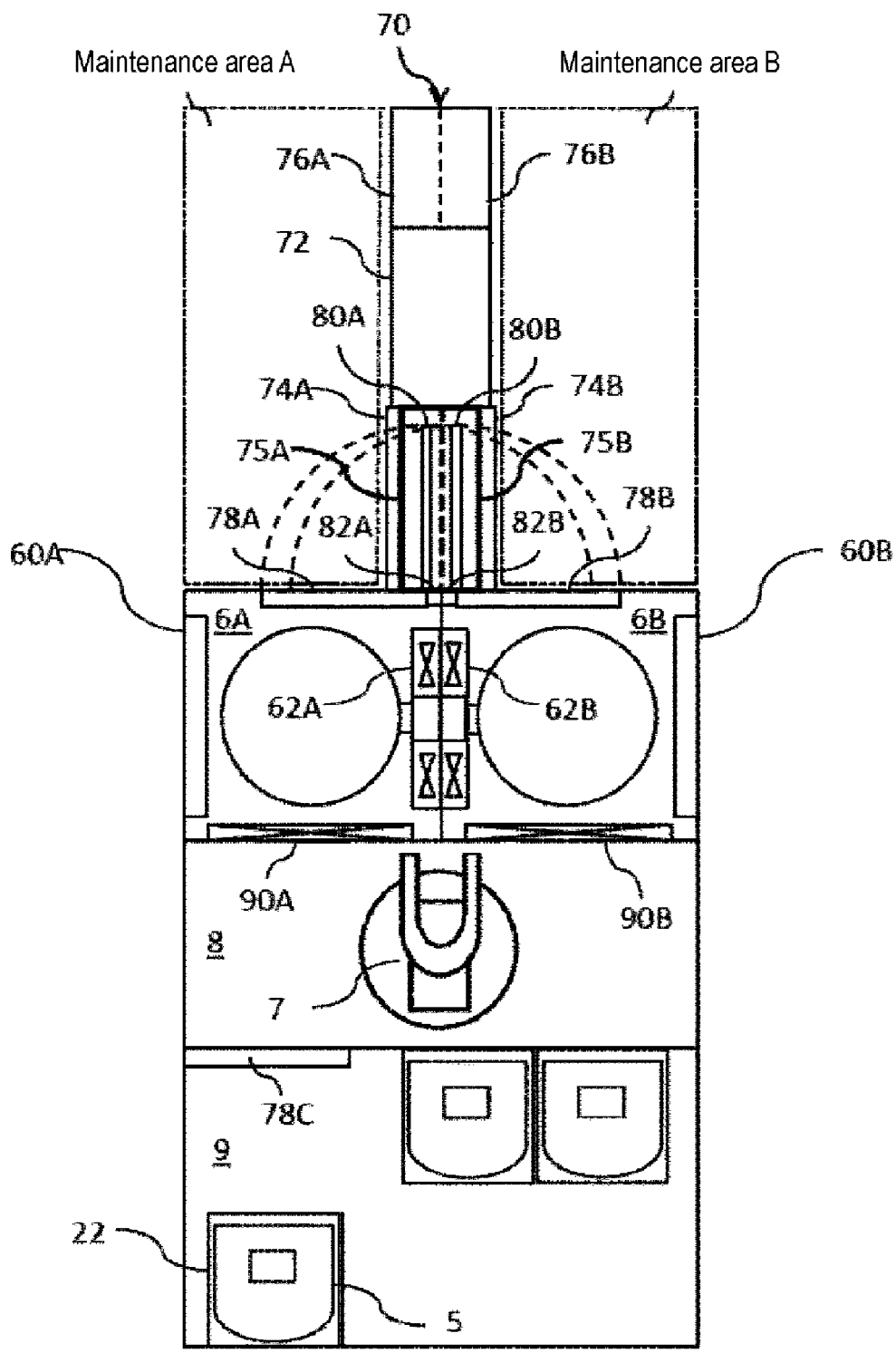
FIG. 1 is a top view schematically showing an example of a substrate processing apparatus suitably used in an embodiment of the present disclosure.

Hereinafter, non-limiting exemplary embodiments of the present disclosure will be described with reference to the drawings. Throughout the drawings, the same or corresponding components are denoted by the same or corresponding reference numerals, and explanation thereof will not be repeated. A storage chamber 9 side to be described later is referred to as a front side (forward side), and the transport chambers 6A and 6B side to be described later is referred to as a back side (backward side). A side facing a boundary line (adjacent surface) of processing modules 3A and 3B to be described later is referred to as an inner side, and a side away from the boundary line is referred to as an outer side.

In the present embodiment, a substrate processing apparatus 2 is configured as a vertical substrate processing apparatus (hereinafter referred to as a processing apparatus) 2 which carries out a substrate processing process such as heat treatment as one process of a manufacturing process in a method of manufacturing a semiconductor device.

Figure 2:
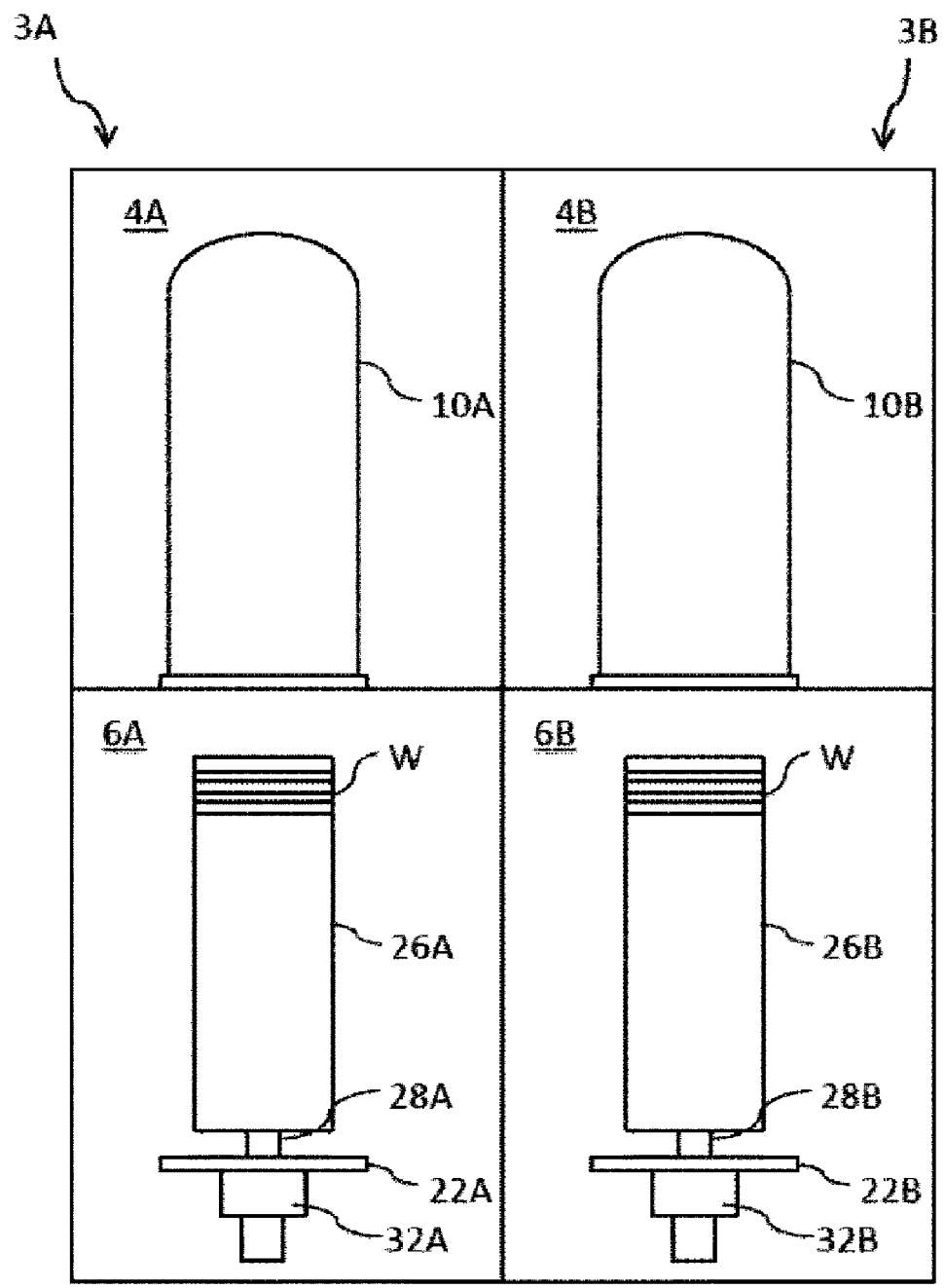
FIG. 2 is a longitudinal sectional view schematically showing an example of a substrate processing apparatus suitably used in an embodiment of the present disclosure.

As shown in FIGS. 1 and 2, the processing apparatus 2 includes two adjacent processing modules 3A and 3B. The processing module 3A is constituted by a process furnace 4A and a transfer chamber 6A. The processing module 3B is constituted by a process furnace 4B and a transfer chamber 6B. Transfer chambers 6A and 6B are disposed below the process furnaces 4A and 4B, respectively. A transfer chamber 8 including a transfer device 7 for transferring a wafer W is disposed adjacent to the front side of the transfer chambers 6A and 6B. A storage chamber 9 for storing a pod (hoop) 5 for storing a plurality of wafers W is connected to the front side of the transfer chamber 8. An I/O port 22 is installed on the entire surface of the storage chamber 9, and the pod 5 is loaded/unloaded into/from the processing apparatus 2 via the I/O port 22.

Figure 3:
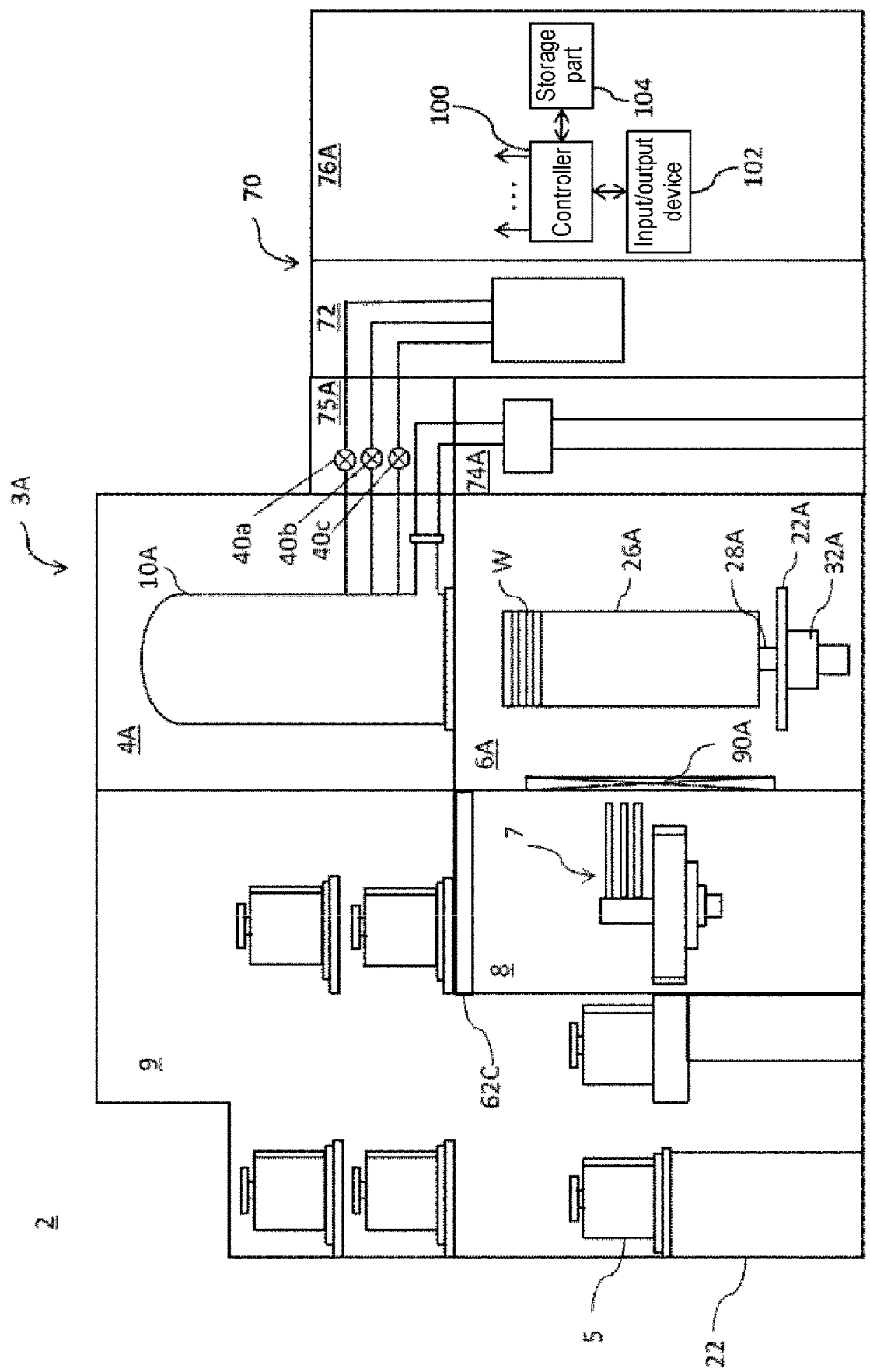
FIG. 3 is a longitudinal sectional view schematically showing an example of a substrate processing apparatus suitably used in an embodiment of the present disclosure.

Gate valves 90A and 90B are installed on the boundary walls (adjacent surfaces) of the transfer chambers 6A and 6B and the transfer chamber 8, respectively. Pressure detectors are respectively installed in the transfer chamber 8 and in the transfer chambers 6A and 6B, and an internal pressure of the transfer chamber 8 is set to be lower than internal pressures of the transfer chambers 6A and 6B. Further, oxygen concentration detectors are respectively installed in the transfer chamber 8 and the transfer chambers 6A and 6B, and an oxygen concentration in the transfer chamber 8A and the transfer chambers 6A and 6B is kept to be lower than an oxygen concentration in the atmosphere. As shown in FIG. 3, a clean unit 62C for supplying clean air into the transfer chamber 8 is installed on a ceiling of the transfer chamber 8. The clean unit 62C is configured to circulate the clean air, for example, an inert gas, in the transfer chamber 8. By circularly purging an inside of the transfer chamber 8 with the inert gas, the inside of the transfer chamber 8 can be made into a clean atmosphere. With such a configuration, it is possible to prevent particles and the like in the transfer chambers 6A and 6B from mixing into the transfer chamber 8 and prevent a natural oxide film from being formed on the wafer W in the transfer chamber 8 and the transfer chambers 6A and 6B.

Since the processing module 3A and the processing module 3B have the same configuration, only the processing module 3A will be representatively described below.

Figure 4:
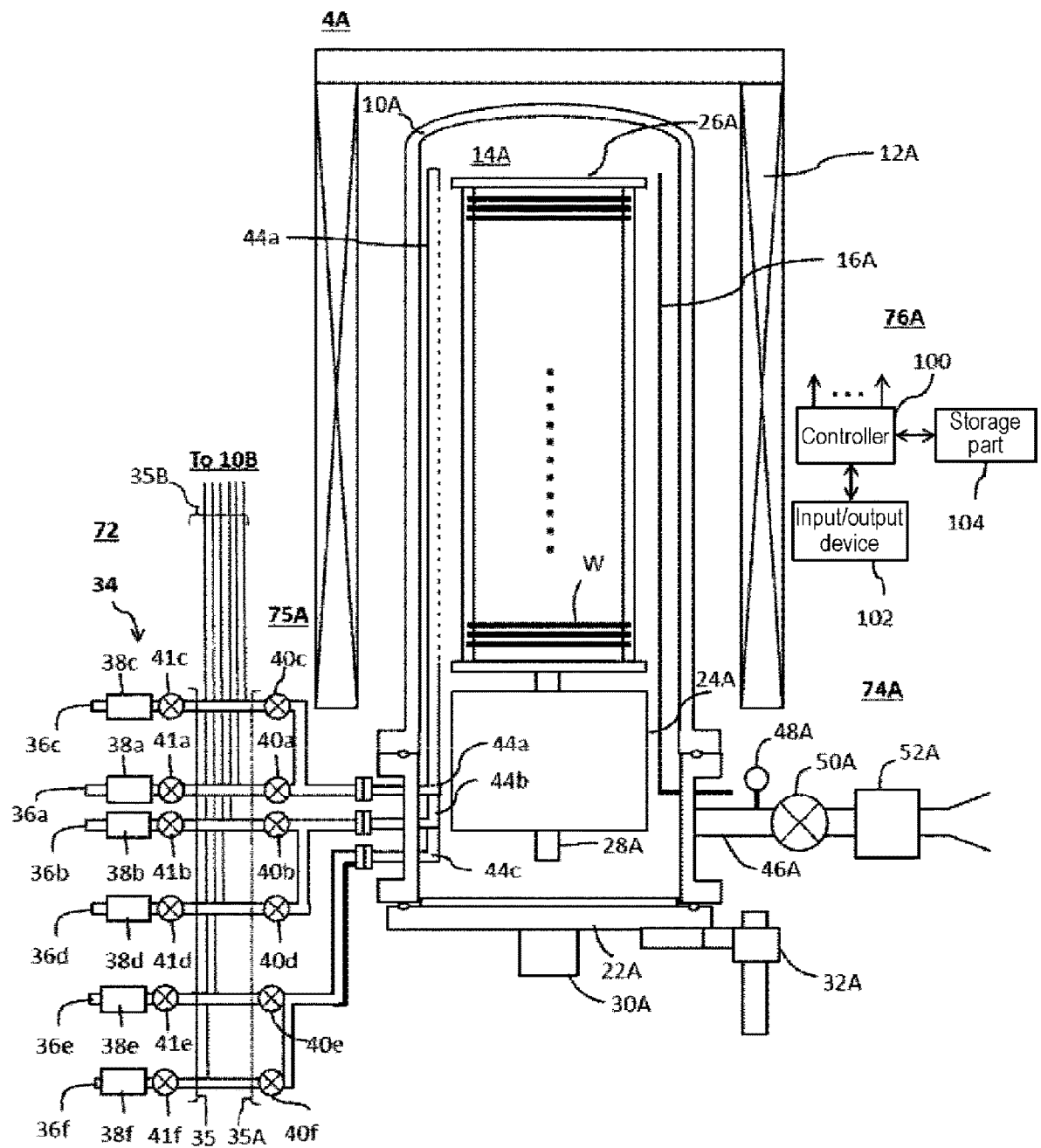
FIG. 4 is a longitudinal sectional view schematically showing an example of a process furnace suitably used in an embodiment of the present disclosure.

As shown in FIG. 4, the process furnace 4A includes a cylindrical reaction tube 10A and a heater 12A as a heating means (heating mechanism) installed on an outer periphery of the reaction tube 10A. The reaction tube is made of, for example, quartz or SiC. A process chamber 14A for processing a wafer W as a substrate is formed inside the reaction tube 10A. A temperature detection part 16A as a temperature detector is installed in the reaction tube 10A. The temperature detection part 16A stands along the inner wall of the reaction tube 10A.

A gas used for substrate processing is supplied into the process chamber 14A by a gas supply mechanism 34 as a gas supply system. The gas supplied by the gas supply mechanism 34 may be changed depending on a type of film to be formed. Here, the gas supply mechanism 34 includes a precursor gas supply part, a reaction gas supply part and an inert gas supply part. The gas supply mechanism 34 is stored in a supply box 72 to be described later. Since the supply box 72 is provided in common for the processing modules 3A and 3B, it is regarded as a common supply box.

The precursor gas supply part, which is a first gas supply part, includes a gas supply pipe 36a. The gas supply pipe 36a is provided with a mass flow controller (MFC) 38a, which is a flow rate controller (flow rate control part), and valves 41a and 40a, which are opening/closing valves such as diaphragm valves, in order of upstream to downstream. The gas supply pipe 36a is connected to a nozzle 44a penetrating a side wall of a manifold 18. The nozzle 44a is vertically installed in the reaction tube 10A and has a plurality of supply holes opened toward wafers W held by a boat 26. A precursor gas is supplied to the wafers W through the supply holes of the nozzle 44a.

Similarly, a reaction gas is supplied to the wafers W from the reaction gas supply part, which is a second gas supply part, through a supply pipe 36b, an MFC 38b, a valve 41b, a valve 40b and a nozzle 44b. An inert gas is supplied to the wafers W from the inert gas supply part through supply pipes 36c and 36d, MFC 38c and 38d, valves 41c and 41d, valves 40c and 40d and nozzles 44a and 44b. The nozzle 44b is vertically installed in the reaction tube 10A and has a plurality of supply holes opened toward the wafers W held by the boat 26. The precursor gas is supplied to the wafers W through the supply holes of the nozzle 44b.

In addition, the gas supply mechanism 34 is provided with a third gas supply part for supplying a reaction gas, a precursor gas, or an inert gas or a cleaning gas that does not directly contribute to the substrate processing, to the wafers W. The reaction gas is supplied to the wafers W from the third gas supply part through a supply pipe 36e, an MFC 38e, a valve 41e, a valve 40e and a nozzle 44c. The inert gas or the cleaning gas is supplied to the wafers W from the inert gas supply part through a supply pipe 36f, an MFC 38f, a valve 41f, a valve 40f and a nozzle 44c. The nozzle 44c is vertically installed in the reaction tube 10A and has a plurality of supply holes opened toward the wafers W held by the boat 26. The precursor gas is supplied to the wafers W through the supply holes of the nozzle 44c.

Three nozzles 44a, 44b and 44c are installed in the reaction tube 10A, so that three types of precursor gases can be supplied into the reaction tube 10A in a predetermined sequence or in a predetermined cycle. Valves 40a, 40b, 40c, 40d, 40e and 40f connected to the nozzles 44a, 44b and 44c in the reaction tube 10A are final valves and are provided in a final valve installation part 75A to be described later. Similarly, three nozzles 44a, 44b and 44c are installed in the reaction tube 10B, so that three types of precursor gases can be supplied into the reaction tube 10B in a predetermined sequence or in a predetermined cycle. Valves 40a, 40b, 40c, 40d, 40e and 40f connected to the nozzles 44a, 44b and 44c in the reaction tube 10B are final valves and are provided in a final valve installation part 75B to be described later.

A plurality of gas pipes 35 on the output side of the valves 41a to 41f are branched into a plurality of gas distribution pipes 35A respectively connected to the valves 40a, 40b, 40c, 40d, 40e and 40f of the reaction tube 10A and a plurality of gas distribution pipes 35B respectively connected to the valves 40a, 40b, 40c, 40d, 40e and 40f of the reaction tube 10B between the valves 41a to 41f and the valves 40a to 40f. The plurality of gas pipes 35 may be regarded as gas pipes in common for the reaction tubes 10A and 10B.

An exhaust pipe 46A is attached to the manifold 18A. A vacuum pump 52A as a vacuum exhaust device is connected to the exhaust pipe 46A via a pressure sensor 48A as a pressure detector (pressure detection part) for detecting the internal pressure of the process chamber 14A and an APC (Auto Pressure Controller) valve 50A as a pressure regulator (pressure regulation part). With such a configuration, the internal pressure of the process chamber 14A can be set to a processing pressure corresponding to the processing. An exhaust system A is mainly constituted by the exhaust pipe 46A, the APC valve 50A and the pressure sensor 48A. The exhaust system A is stored in an exhaust box 74A to be described later. One vacuum pump 52A may be installed in common for the processing modules 3A and 3B.

The process chamber 14A accommodates therein a boat 26A as a substrate holder which vertically supports a plurality of wafers W, for example, 25 to 150 wafers W, in a shelf shape. The boat 26A is supported above a heat insulating part 24A by a rotary shaft 28A penetrating a lid 22A and the heat insulating part 24A. The rotary shaft 28A is connected to a rotation mechanism 30A installed below the lid 22A. The rotary shaft 28A is configured to be rotatable in a state in which the inside of the reaction tube 10A is air-tightly sealed. The lid 22A is vertically driven by a boat elevator 32A as an elevation mechanism. Thus, the boat 26A and the lid 22A are integrally raised and lowered, and the boat 26A is loaded/unloaded into/from the reaction tube 10A.

Transfer of the wafers W onto the boat 26A is performed in the transfer chamber 6A. As shown in FIG. 1, a clean unit 60A is installed on one side in the transfer chamber 6A (an outer side of the transfer chamber 6A, or a side opposite to a side facing the transfer chamber 6B). The clean unit 60A is configured to circulate clean air (for example, an inert gas) inside the transfer chamber 6A. The inert gas supplied into the transfer chamber 6A is exhausted from the transfer chamber 6A by an exhaust unit 62A installed on the side surface facing the clean unit 60A (the side surface facing the transfer chamber 6B) with the boat 26A interposed between the exhaust unit 62A and the clean unit 60A, and is resupplied from the clean unit 60A into the transfer chamber 6A (circulation purge). The internal pressure of the transfer chamber 6A is set to be lower than the internal pressure of the transfer chamber 8. Further, the oxygen concentration in the transfer chamber 6A is set to be lower than the oxygen concentration in the atmosphere. With such a configuration, it is possible to prevent a natural oxide film from being formed on the wafers W during the transfer operation of the wafers W.

A controller 100 is connected to and controls the rotation mechanism 30A, the boat elevator 32A, the MFCs 38a to 38f and the valves 41a to 40f of the gas supply mechanism 34A, and the APC valve 50A. The controller 100 includes, for example, a microprocessor (computer) including a CPU, and is configured to control the operation of the processing apparatus 2. An input/output device 102 configured as, for example, a touch panel or the like is connected to the controller 100. One controller 100 may be installed for each of the processing module 3A and the processing module 3B, or may be installed in common for them.

A storage part 104 may be a storage device (hard disk or flash memory) incorporated in the controller 100, or an external portable recording device (magnetic tape, magnetic disk such as flexible disk or hard disk, optical disk such as CD or DVD, magneto-optical disk such as MO, or a semiconductor memory such as USB memory or memory card). A program may be provided to the computer using communication means such as the Internet or a dedicated line. When the controller 100 reads the program from the storage part 104 according to an instruction from the input/output device 102 as necessary and executes a process according to a read recipe, the processing apparatus 2 execute a desired process under control of the controller 100. The controller 100 is stored in a controller box 76 (76A and 76B). When the controller 100 is installed for each of the processing module 3A and the processing module 3B, the controller 100 (A) for controlling the processing module 3A is installed in the controller box 76A, and the controller 100 (B) for controlling the processing module 3B is installed in the controller box 76B.

Next, a process of forming a film on a substrate (film-forming process) using the above-described processing apparatus 2 will be described. Here, an example of forming a silicon nitride (SiN) film on a wafer W by supplying a hexachlorodisilane ($Si_2Cl_6$, abbreviation: HCDS) gas as a first process gas (precursor gas) and an ammonia ($NH_3$) as a second process gas (reaction gas) to the wafer W will be described. In the following description, the operations of various parts constituting the processing apparatus 2 are controlled by the controller 100.

In the film-forming process according to the present embodiment, a SiN film is formed on a wafer W by repeating a step of supplying an HCDS gas to the wafer W in the process chamber 14A, a step of removing the HCDS gas (residual gas) from the inside of the process chamber 14A, a step of supplying an $NH_3$ gas to the wafer W in the process chamber 14A, and a step of removing the $NH_3$ gas (residual gas) from the inside of the process chamber 14A a predetermined number of times (once or more). In the present disclosure, this film formation sequence is written as follows for the sake of convenience.

$$(HCDS \rightarrow NH_3) \times n \Rightarrow SiN$$

(Wafer Charging and Boat Loading)

The gate valve 90A is opened, and the wafer W is transferred to the boat 26A. When a plurality of wafers W are loaded into the boat 26A (wafer charging), the gate valve 90A is closed. The boat 26A is loaded into the process chamber 14A by the boat elevator 32A (boat loading), and the lower opening of the reaction tube 10A is in a state of being air-tightly closed (sealed) by the lid 22A.

(Pressure Adjustment and Temperature Adjustment)

The process chamber 14A is vacuum-exhausted (evacuated) by the vacuum pump 52A so that the inside of the process chamber 14A reaches a predetermined pressure (degree of vacuum). The internal pressure of the process chamber 14A is measured by the pressure sensor 48A, and the APC valve 50A is feedback-controlled based on the measured pressure information. Further, the wafer W in the process chamber 14A is heated by the heater 12A so as to have a predetermined temperature. At this time, a condition of conduction of current to the heater 12A is feedback-controlled based on the temperature information detected by the temperature detection part 16A so that the process chamber 14A has a predetermined temperature distribution. Further, the rotation of the boat 26A and the wafer W by the rotation mechanism 30A is started.

(Film-Forming Process)

[Precursor Gas Supplying Step]

When the internal temperature of the process chamber 14A is stabilized at a preset processing temperature, an HCDS gas is supplied to the wafer W in the process chamber 14A. The HCDS gas is controlled by the MFC 38a to have a desired flow rate, and is supplied into the process chamber 14A via the gas supply pipe 36a, the valves 41a and 40a and the nozzle 44a. The valve 40a opens when the valve 41a of processing module 3A and/or 3B opens. The valve 40a operates on interlocking basis, moreover the valve 40a could operates more slowly than the valve 41a for longer life time. That is achieved by restricting an air flow for an air-operated valve or by limiting applied voltage for a solenoid-operated valve. For example, a transition time of the valve 41a from close to open could be set to 5 ms whereas that of valve 40a is 3 ms. The same applies to the other valves 41b to 41f.

[Precursor Gas Exhausting Step]

Next, the supply of the HCDS gas is stopped, and the inside of the process chamber 14A is vacuum-exhausted by the vacuum pump 52A. At this time, an $N_2$ gas may be supplied as an inert gas from the inert gas supply part into the process chamber 14A (inert gas purge).

[Reaction Gas Supplying Step]

Next, an $NH_3$ gas is supplied to the wafer W in the process chamber 14A. The $NH_3$ gas is controlled by the MFC 38$b$ to have a desired flow rate, and is supplied into the process chamber 14A via the gas supply pipe 36$b$, the valves 41$b$ and 40$b$ and the nozzle 44$b$.

[Reaction Gas Exhausting Step]

Next, the supply of the $NH_3$ gas is stopped, and the inside of the process chamber 14A is vacuum-exhausted by the vacuum pump 52A. At this time, an $N_2$ gas may be supplied from the inert gas supply part into the process chamber 14A (inert gas purge). By performing a cycle of performing the above-described four steps a predetermined number of times (once or more), a SiN film having a predetermined composition and a predetermined film thickness can be formed on the wafer W.

(Boat Unloading and Wafer Discharging)

After the film having a predetermined film thickness is formed, an $N_2$ gas is supplied from the inert gas supply part, the inside of the process chamber 14 A is replaced with the $N_2$ gas, and the internal pressure of the process chamber 14A is restored to the normal pressure. Thereafter, the lid 22A is lowered by the boat elevator 32A, and the boat 26A is unloaded from the reaction tube 10A (boat unloading). Thereafter, the processed wafer W is taken out of the boat 26A (wafer discharging).

Thereafter, the wafer W may be stored in the pod 5 and unloaded out of the processing apparatus 2, or may be transferred to the process furnace 4B and continuously subjected to substrate processing such as annealing. When processing the wafer W in the process furnace 4B continuously after processing of the wafer W in the process furnace 4A, the gate valves 90A and 90B are opened, and the wafer W is directly transferred from the boat 26A to the boat 26B. Subsequent loading/unloading of the wafer W into/from the process furnace 4B is performed in the same procedure as the above-described substrate processing by the process furnace 4A. Further, the substrate processing in the process furnace 4B is performed, for example, in the same procedure as the above-described substrate processing by the process furnace 4A.

The processing conditions at the time of forming the SiN film on the wafer W are exemplified as follows.

Processing temperature (wafer temperature): 100 degrees C. to 800 degrees C.

Processing pressure (internal pressure of process chamber): 5 Pa to 4,000 Pa

HCDS gas supply flow rate: 1 sccm to 2,000 sccm $NH_3$ gas supply flow rate: 100 sccm to 30,000 sccm $N_2$ gas supply flow rate: 1 sccm to 50,000 sccm By setting the processing conditions to value within the respective ranges, the film-forming process can be appropriately performed.

Next, a back surface configuration of the processing apparatus 2 will be described.

For example, if the boat 26 is broken, the boat 26 needs to be replaced. If the reaction tube 10 is broken or needs to be cleaned, it is necessary to remove the reaction tube 10. In this manner, when maintenance for the transfer chamber 6 or the process furnace 4 is performed, the maintenance is performed from maintenance areas A and B on the back side of the processing apparatus 2.

As shown in FIG. 1, maintenance ports 78A and 78B are respectively formed on the back sides of the transfer chambers 6A and 6B. The maintenance port 78A is formed on the transfer chamber 6B side of the transfer chamber 6A, and the maintenance port 78B is formed on the transfer chamber 6A side of the transfer chamber 6B. The maintenance ports 78A and 78B are opened and closed by maintenance doors 80A and 80B, respectively. The maintenance doors 80A and 80B are configured to be rotated with hinges 82A and 82B as base shafts, respectively. The hinge 82A is installed on the transfer chamber 6B side of the transfer chamber 6A, and the hinge 82B is installed on the transfer chamber 6A side of the transfer chamber 6B. That is, the hinges 82A and 82B are installed adjacent to each other near the inner corner located on the adjacent surfaces on the back sides of the transfer chambers 6A and 6B. The maintenance areas are formed on the processing module 3B side on the back surface of the processing module 3A and on the processing module 3A side on the back surface of the processing module 3B.

As indicated by imaginary lines, as the maintenance doors 80A and 80B are horizontally rotated backward on the back side of the transfer chambers 6A and 6B around the hinges 82A and 82B, the back side maintenance ports 78A and 78B are opened. The maintenance door 80A is configured to be opened to the left at 180 degrees toward the transfer chamber 6A. The maintenance door 80B is configured to be opened to the right at 180 degrees toward the transfer chamber 6B. That is, the maintenance door 80A is rotated clockwise toward the transfer chamber 6A and the maintenance door 80B is rotated counterclockwise toward the transfer chamber 6A. In other words, the maintenance doors 80A and 80B are rotated in opposite directions. Since the maintenance doors 80A and 80B are configured to be removable, they may be removed for maintenance.

A utility system 70 is installed near the back sides of the transfer chamber 6A and 6B. The utility system 70 is interposed between maintenance areas A and B. When maintenance of the utility system 70 is performed, the maintenance is performed from the maintenance areas A and B.

The utility system 70 includes final valve installation parts 75A and 75B, exhaust boxes 74A and 74B, a supply box 72 and controller boxes 76A and 76B.

The utility system 70 is constituted by the exhaust boxes 74A and 74B, the supply box 72 and the controller boxes 76A and 76B in this order from the housing side (the transfer chambers 6A and 6B). The final valve installation parts 75A and 75B are provided above the exhaust boxes 74A and 74B. The maintenance ports of the boxes of the utility system 70 are formed on the maintenance areas A and B, respectively. The supply box 72 is disposed on the side opposite to the side adjacent to the transfer chamber 6A of the exhaust box 74A, and a supply box 72B is disposed adjacent to the side adjacent to the transfer chamber 6B on the exhaust box 74B.

As shown in FIG. 3, in the processing module 3A, the final valve installation part 75A where the final valves (the valves 40$a$, 40$b$ and 40$c$ located at the lowermost stage of the gas supply system) of the gas supply mechanism 34 are installed is disposed above the exhaust box 74A. Preferably, it is disposed just above (right above) the exhaust box 74A. With such a configuration, even when the supply box 72 is disposed away from the housing side, since the pipe length from the final valves to the process chamber can be shortened, the quality of film formation can be improved. Although not shown in FIG. 3, in addition to the valves 40$a$, 40*b* and 40*c*, the valves 40*d*, 40*e* and 40*f* are also disposed in the final valve installation part 75A.

In addition, although not shown, in the processing module 3B, the final valve installation part 75B where the final valves (the valves 40*a*, 40*b* and 40*c* located at the lowermost stage of the gas supply system) of the gas supply mechanism 34 are installed is disposed above the exhaust box 74B. Preferably, it is disposed just above (right above) the exhaust box 74B. With such a configuration, even when the supply box 72 is disposed away from the housing side, since the pipe length from the final valves to the process chamber can be shortened, the quality of film formation can be improved. In addition to the valves 40*a*, 40*b* and 40*c*, the valves 40*d*, 40*e* and 40*f* are also disposed in the final valve installation part 75B.

As shown in FIG. 5, the configurations of the processing modules 3A and 3B and the utility system 70 are arranged in plane symmetry with respect to an adjacent surface S1 of the processing modules 3A and 3B. The reaction tubes 10A and 10B are also arranged in plane symmetry with respect to the adjacent surface S1 of the processing modules 3A and 3B. Thus, pipes are arranged such that the pipe lengths of the exhaust pipes 46A and 46B from the processing modules 3A and 3B to the exhaust boxes 74A and 74B are substantially the same in the processing modules 3A and 3B. In addition, pipes (gas pipes) are arranged such that the pipe lengths from final valves 40A and 40B installed in the final valve installation parts 75A and 75B to nozzles 44A and 44B are substantially the same in the processing modules 3A and 3B.

In FIG. 5, the final valve 40A indicates the valves 40*a* to 40*f* of the processing module 3A, and the final valve 40B indicates the valves 40*a* to 40*f* of the processing module 3B. The nozzle 44A indicates the nozzles 44*a* to 44*c* of the processing module 3A, and the nozzle 44B indicates the nozzles 44*a* to 44*c* of the processing module 3B. For example, when a pipe 10Aa corresponds to a pipe between the valve 40*a* of the processing module 3A and the nozzle 44*a* of the processing module 3A and a pipe 10Ba corresponds to a pipe between the valve 40*a* of the processing module 3B and the nozzle 44*a* of the processing module 3B, the pipe 10Aa and the pipe 10Ba have substantially the pipe length. In addition, when a pipe 10Ab corresponds to a pipe between the valve 40*b* of the processing module 3A and the nozzle 44*b* of the processing module 3A and a pipe 10Bb corresponds to a pipe between the valve 40*b* of the processing module 3B and the nozzle 44*b* of the processing module 3B, the pipe 10Ab and the pipe 10Bb have substantially the pipe length. Thus, an arrival time when a gas is supplied from the supply box 72 to the nozzle 44*a* of the processing module 3A via the valve 40*a* and the pipe 10Aa of the processing module 3A may be the same as an arrival time when the same gas is supplied from the supply box 72 to the nozzle 44*a* of the processing module 3B via the valve 40*a* and the pipe 10Ba of the processing module 3B. Therefore, recipe management of the processing modules 3A and 3B by the controller 100 can be facilitated. Furthermore, as indicated by arrows in FIG. 5, rotation directions of wafers W in the process furnaces 4A and 4B are also set to be opposite to each other.

The form of arrangement of the reaction tubes 10A and 10B is not limited to that shown in FIG. 5. The nozzles 44A and 44B may be installed to correspond to the final valve installation parts 75A and 75B, respectively. The reaction tubes 10A and 10B may be arranged such that the exhaust pipes 46A and 46B leading to the exhaust boxes 74A and 74B have the shortest length. However, the reaction tubes 10A and 10B may be disposed in plane symmetry with respect to the adjacent surface S1 of the processing modules 3A and 3B.

Since the common supply box 72 is provided for the processing modules 3A and 3B and the gas pipes from the supply box 72 to the final valves 40A and 40B are shared, it is possible to save a space of the substrate processing apparatus.

In addition, a footprint required by the substrate processing apparatus 2 is lowered, and it is possible to reduce a use area of a clean room with respect to a required amount of production, which is very advantageous in terms of economy.

Figure 6A:
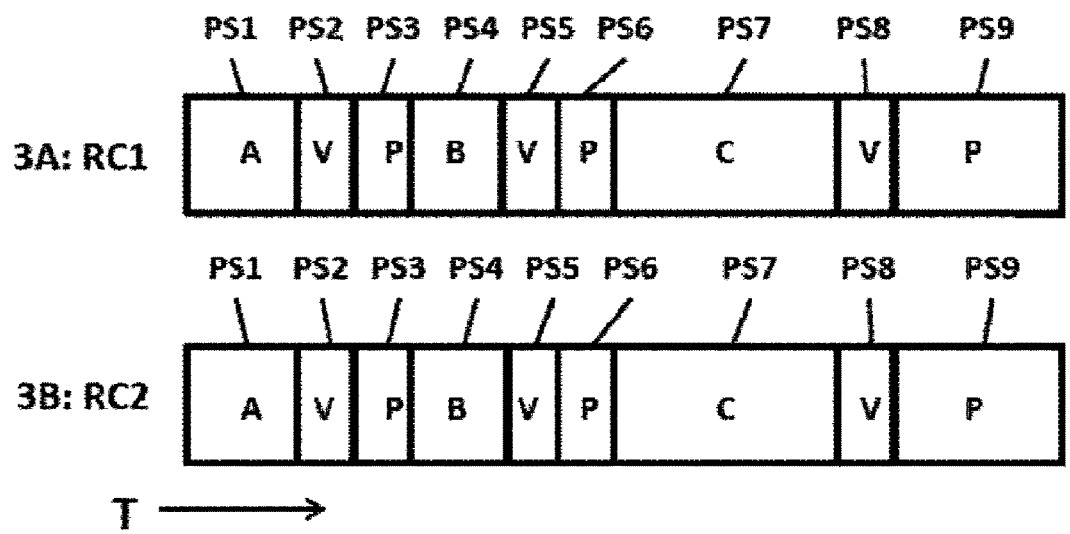
FIG. 6A is a view for explaining an example of control of a recipe by a controller.
Figure 6B:
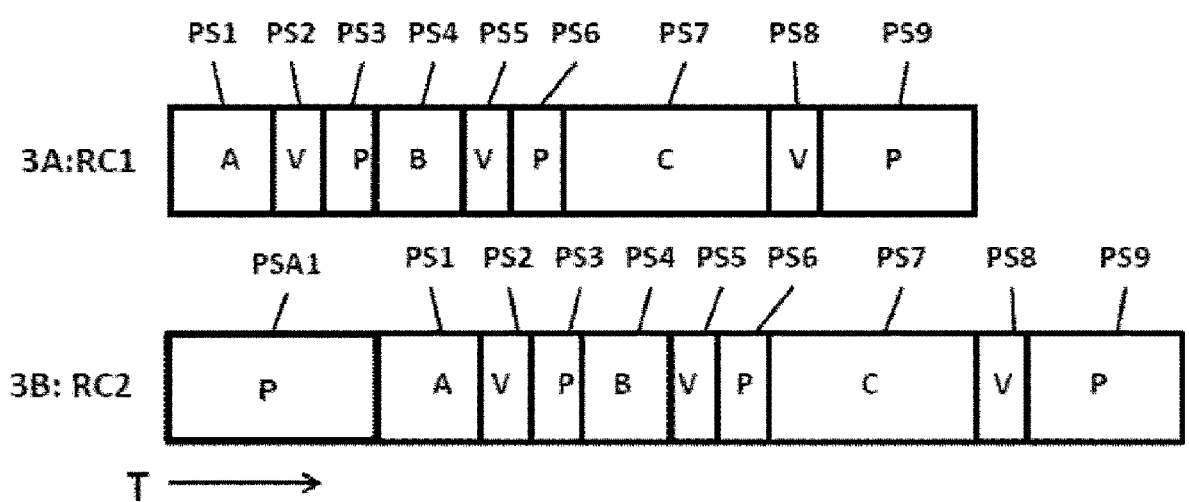
FIG. 6B is a view for explaining an example of control of a recipe by a controller.

FIGS. 6A, 6B and 6C are views for explaining an example of control of a recipe by the controller. A recipe is one describing a supply amount of each process gas such as reaction gas and precursor gas, a target vacuum degree (or an exhaust speed), process chamber temperature and the like. in a time series, and may include a pattern repeated at a fixed cycle. The term recipe may, in a narrow sense, refer to one cycle of this repeated pattern. When a created recipe is executed by the controller 100, the processing apparatus 2 executes a desired process under the control of the controller 100. When the processing apparatus 2 includes the processing modules 3A and 3B, the same gas may be used between the processing modules 3A and 3B depending on the timing of starting the recipe.

In the present embodiment, the controller 100 that manages the recipe has a mutual monitoring function so that the same process gas cannot be simultaneously flown into the reaction tubes 10A and 10B of the processing modules 3A and 3B. By registering the target gas and valve to be monitored in a parameter or recipe in the controller, the controller 100 mutually monitors the recipe for the processing modules 3A and 3B based on the registered gas and valve, and performs control to optimize the recipe start time and the like so that the same process gas cannot be simultaneously flown into the processing modules 3A and 3B. The optimization of the recipe start time and the like can be adjusted using evacuation time of the vacuum pump 52A to evacuate the reaction tubes 10A and 10B or purge time for purging the reaction tubes 10A and 10B with an $N_2$ gas. The mutual monitoring and control includes a valve level and a recipe level.

FIG. 6A shows an example of recipes RC1 and RC2 executed respectively by the processing modules 3A and 3B. The recipes RC1 and RC2 are the same recipes, and use three process gases A, B and C. In order to form the same film on the respective substrates in the reaction tubes 10A and 10B, the recipes RC1 and RC2 of substantially the same gas supply sequence are repeatedly executed for multiple cycles. Each of the recipes RC1 and RC2 includes process steps PS1 to PS9 which are substantially the same gas supply sequence. The process step PS1 is a process (A) of supplying a process gas A into the reaction tube 10A or 10B. The process step PS4 is a process (B) of supplying a process gas B into the reaction tube 10A or 10B. The process step PS7 is a process (C) of supplying a process gas C into the reaction tube 10A or 10B. The process steps PS2, PS5 and PS8 are performed after the process steps PS1, PS4 and PS7, respectively. The process steps PS2, PS5 and PS8 are processes (V) of evacuating the reaction tube 10A or 10B by setting the target vacuum degree to a relatively low pressure (for example, 10 to 100 Pa). The process steps PS3, PS6 and PS9 are performed after the process steps PS2, PS5 and PS8, respectively. The process steps PS3, PS6 and PS9 are processes (P) of evacuating the reaction tubes 10A and 10B while flowing a purge gas (N₂ gas) into the reaction tubes 10A and 10B.

As shown in FIG. 6A, in the recipes RC1 and RC2, when the recipes RC1 and RC2 are started with a short time difference with respect to time T, it is assumed that the same process gases A, B and C are simultaneously used. That is, the process steps PS1, PS4 and PS7 of the processing module 3A and the process steps PS1, PS4 and PS7 of the processing module 3B may be executed simultaneously. However, there is only one mass flow controller (MFC) corresponding to each of the process gases A, B and C. As shown in FIG. 4, in the gas supply mechanism 34 stored in the supply box 72, for example, a mass flow controller for the process gas A is the MFC 38a, a mass flow controller for the process gas B is the MFC 38b, and a mass flow controller for the process gas C is the MFC 38c. For this reason, when the same process gas A, B or C is simultaneously used in the processing modules 3A and 3B, a flow rate to each of the processing modules 3A and 3B cannot be controlled with an accuracy equivalent to a conventional accuracy and the recipe will be different between the modules 3A and 3B. The difference in recipe between the processing modules 3A and 3B affects the quality of the film formed in the processing modules 3A and 3B. For this reason, the same process gas A, B or C may not be used at the same time in the processing modules 3A and 3B in some embodiments.

In the control of the valve level, the controllers 100 of the processing module 3A and 3B mutually monitor an opening/closing state of the valves 40a to 40c of the processing module 3A and an opening/closing state of the valves 40a to 40c of the processing module 3B between the processing modules 3A and 3B. This control of the valve level is also called an interlock.

For example, when the corresponding final valves (that is, connected by the same distribution pipe) of the processing module 3B on the other side are closed, the controller 100 of the processing module 3A opens the final valves of its own processing module 3A according to the recipe. On the other hand, when the corresponding final valves (that is, connected by the same distribution pipe) of the processing module 3B on the other side are opened, the controller 100 of the processing module 3A performs control to interrupt the recipe of its own processing module 3A until the final valves are closed. In addition, when the corresponding final valves (that is, connected by the same distribution pipe) of the processing module 3A on the other side are closed, the controller 100 of the processing module 3B opens the final valves of its own processing module 3B according to the recipe. On the other hand, when the corresponding final valves (that is, connected by the same distribution pipe) of the processing module 3A on the other side are opened, the controller 100 of the processing module 3B performs control to interrupt the recipe of its own processing module 3B until the final valves are closed.

On the other hand, in the control of the process recipe level, the controller 100 monitors progresses of the recipes RC1 and RC2 at each timing such as the start of the recipes RC1 and RC2 or before the boat loading, etc. and predicts the timing of sequence in which the used gases A, B and C flow. In the processing modules 3A and 3B, when the same process gas A, B or C does not flow at the same timing, the recipes RC1 and RC2 proceed as they are. On the other hand, in the processing modules 3A and 3B, when the same process gas A, B or C is predicted to flow at the same timing, the controller 100 calculates a sequence in which the same process gas does not flow at the same time, and performs control to shift the timing of the supply of the gas used.

That is, in the processing modules 3A and 3B, in order to form the same film, processes of repeating substantially the same gas supply sequence are performed in parallel with each other while having a shift time therebetween. The shift time is determined by delaying the gas supply sequence of one of the processing modules 3A and 3B which will start processing later so that the supply timing of a specific gas among the plurality of process gases A, B and C does not overlap with the gas supply sequence of the other of the processing modules 3A and 3B which has previously started processing.

For example, as shown in FIG. 6A, it is assumed that the controller 100 predicts the timing of the gas supply sequence in which the process gases A, B and C used flow when the recipes RC1 and RC2 start. That is, it is assumed that the same process gas A, B or C is predicted to flow into the processing modules 3A and 3B at the same timing. In this case, the controller 100 calculates a sequence in which the same process gas does not flow at the same time, and performs control to shift the timing of supplying the gas used. That is, before the start of the recipes RC1 and RC2, the controller 100 generates the recipe RC2 for which the timing of the gas supply sequence is shifted in time so that the same process gas A, B or C does not flow at the same timing in the processing modules 3A and 3B. As shown in FIG. 6B, in the recipe RC2 performed in the processing module 3B, a process step PSA1 is automatically added by the controller 100 before the process step PS1. The process step PSA1 is, for example, a process (P) of evacuating the reaction tube 10B while flowing a purge gas (N₂ gas) into the reaction tube 10B. When the recipe RC2 (PS1 to PS9) is executed for a plurality of cycles, the process step PSA1 is added only before the first process step PS1 of the first cycle. The process step PSA1 is not added before the process step PS1 in the second and subsequent cycles of the recipe RC2 (PS1 to PS9). That is, after performing the last process step PS9 of the first cycle of the recipe RC2 (PS1 to PS9), the first process step PS1 of the second cycle of the recipe RC2 (PS1 to PS9) is performed. Similarly, after performing the last process step PS9 of the second cycle of the recipe RC2 (PS1 to PS9), the first process step PS1 of the third cycle of the recipe RC2 (PS1 to PS9) is performed.

In the example of FIG. 6B, among the process gases A, B and C which cannot be flown at the same time, the one having the longest supply time ($t_{max}$) in one cycle of the recipes RC1 and RC2 is selected (here PS7), and a recipe time difference $t_{diff}$ between the processing modules 3A and 3B is adjusted by delaying the start time of the process step PS1 of either recipe RC1 or RC2 so that the recipe time difference $t_{diff}$ is equal to $t_{max}+n^*t_{cycle}$. In the example of FIG. 6B, the start time of PS1 in the recipe RC2 is delayed by a time when the process step PSA1 is added, as compared with the start time of PS1 in the recipe RC1. That is, the adjusted time difference $t_{diff\_adj}=t_{max}*t_{cycle}$ (where, n is an arbitrary integer and $t_{cycle}$ is the time of one cycle of the recipe: the time from the start time of PS1 to the end time of PS7). It is assumed that $t_{max} \le t_{cycle}/2$.

If it is preferable to reduce the delay time, depending on the current time difference (the advancing time of the recipe RC2 of the current processing module 3B based on the recipe RC1 of the processing module 3A) $t_{diff}$, {
if ($t_{max} \le (|t_{diff}|\% t_{cycle}) < t_{max} t_{cycle}/2$) then
{the advancing processing module is delayed by ($|t_{diff}|\% t_{cycle})-t_{max}$ (i.e., $t_{diff\_adj}=t_{diff}-((|t_{diff}|\% t_{cycle})-t_{max}))$;

else if $((|t_{diff}|\% \ t_{cycle}) < t_{max})$ then {the delayed PM is delayed by $(|t_{diff}|\% \ t_{cycle}) - t_{max}$;}

Else {the delayed processing module is delayed by $t_{cycle} - (|t_{diff}|\% \ t_{cycle}) - t_{max}$;}
}

Where, % is an operator of the least nonnegative remainder. When $0 < (t_{diff}\% \ t_{cycle}) < t_{cycle}/2$, the processing module 3A is in progress. Otherwise, the processing module 3B is in progress.

The controller 100 also has an adjustment function to make the heat histories of the process chambers 14A and 14B equal to each other. It is possible to set the determined time and automatically adjust the time for waiting for the purge time set for the history between batches as well as the recipes in simultaneous progression. That is, in the last cycle in which the recipes RC1 and RC2 of the processing modules 3A and 3B shown in FIG. 6B are repeatedly executed in multiple cycles, the process step PS9 of the recipe RC1 of the processing module 3A will end earlier in time than the process step PS9 of the recipe RC2 of the processing module 3B. Therefore, the heat history of the process chamber 14A and the heat history of the process chamber 14B will be different from each other.

As shown in FIG. 6C, in the last cycle of the recipe RC1 of the processing module 3A, a process step PSA2 of the same time as PSA1 is automatically added by the controller 100 after the process step PS9. Thus, the heat history of the process chamber 14A and the heat history of the process chamber 14B can be equal to each other. The process step PSA2 is, for example, a process (P) of evacuating the reaction tube 10A while flowing a purge gas ($N_2$ gas) into the reaction tube 10A.

The processing module 3A and the processing module 3B basically operate asynchronously, and dependency between the processing module 3A and the processing module 3B is small. Therefore, even if one of the processing module 3A and the processing module 3B is stopped due to a failure or the like, the other of the processing module 3A and the processing module 3B can continue the processing.

Figure 7:
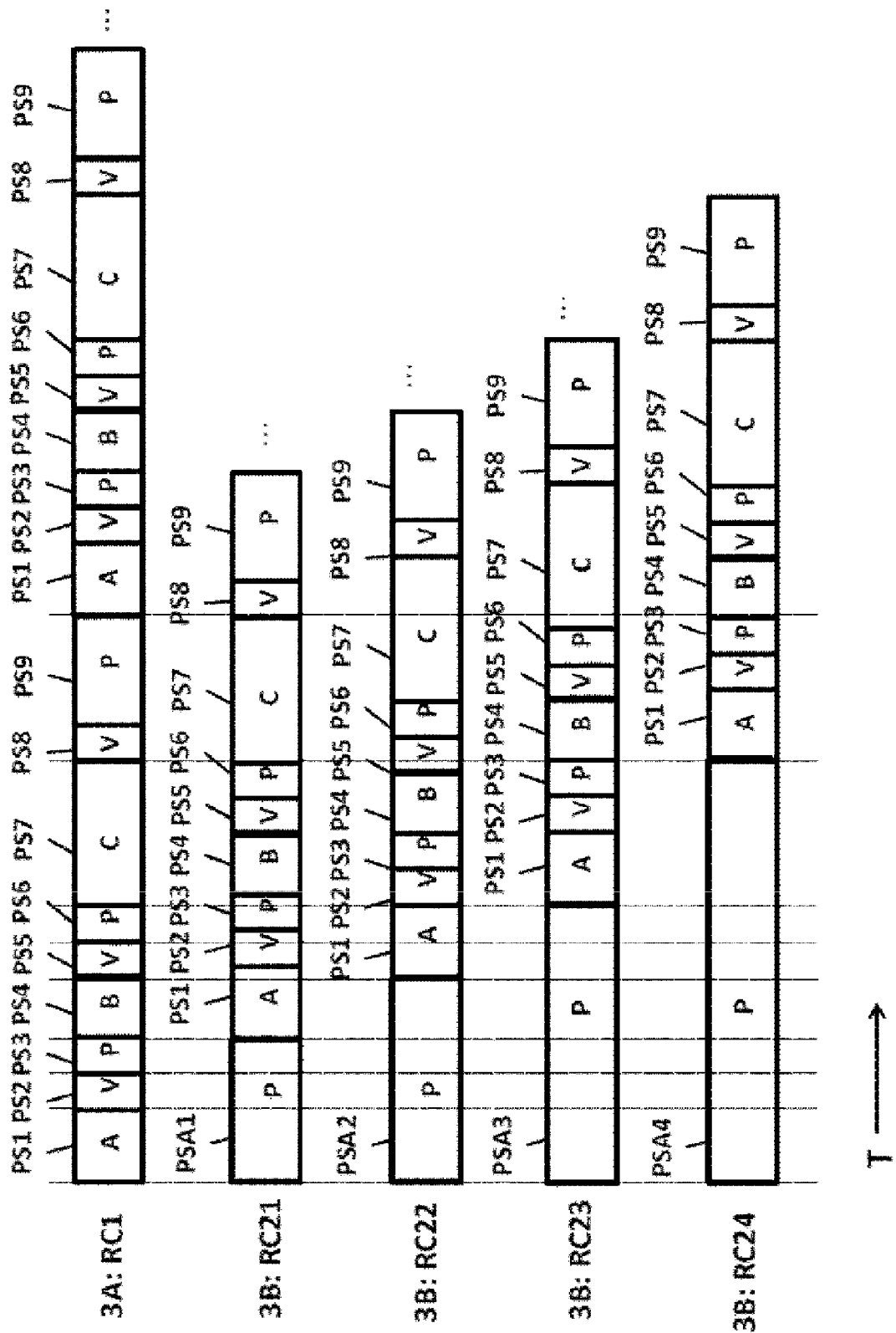
FIG. 7 is a view for explaining another example of control of the recipe by the controller.

FIG. 7 is a view for explaining another example of control of the recipe by the controller. FIG. 7 shows four examples in which processing times of process steps (PSA1 to PSA4) added before the process step PS1 are different in the recipe RC2 performed in the processing module 3B.

A recipe RC21 shown in FIG. 7 is the same as the recipe RC2 shown in FIG. 6B, and is based on a rule that the advancing time of the recipe RC21 is shifted by the supply time of the process gas C for which the supply time in one cycle is the longest. Therefore, in the recipe RC21, the process step PSA1 is added before the process step PS1. Thus, after the process step PS7 of supplying the gas C to the processing module 3A is completed, the process step PS7 of supplying the gas C to the processing module 3B is subsequently started. Alternatively, it can be said that the recipe RC21 is based on a rule that the exhaust timing of the process gases A and B and the exhaust timing of the process gas C do not overlap with each other. According to this rule, when the process gas C undergoes a gas phase reaction with the process gases A and B, it is possible to suppress generation of undesirable solids in the upstream of the common vacuum pump 52. Alternatively, it can be said that the recipe RC21 is based on a rule that the end of the purge process of the process gases A, B and C does not overlap with the exhaust process of any gas. According to this rule, it is possible to prevent an increase in residual gas concentration at the end of purge.

In a recipe RC22 shown in FIG. 7, a process step PSA2 is added before the process step PS1. Thus, after using the process gases A and B in the processing module 3A (after the end of the process step PS4), the process step PS1 of using the process gas A is started in the processing module 3B.

In a recipe RC23 shown in FIG. 7, a process step PSA3 is added before the process step PS1. The recipe RC23 is based on a rule that the phase of the recipe is simply inverted between the processing modules 3A and 3B (that is, the time difference is set to $t_{diff\_adj} = t_{cycle}/2$). According to this rule, due to its temporal symmetry, even in a case where a buffer tank is provided between the gas supply system 34 and the final valve installation parts 75A and 75B, a gas can be uniformly supplied to the processing modules 3A and 3B under the same conditions. Alternatively, it can be said that the recipe RC23 is based on a rule that the exhaust timings of the process gases A, B and C do not overlap with each other. This is suitable when a total time of continuous supply, exhaust and purge steps for one gas is $t_{cycle}/2$ or more.

In a recipe RC24 shown in FIG. 7, a process step PSA4 is added before the process step PS1. Thus, after the end of the supply of the process gas C to the processing module 3B (after the end of the process step PS7), the supply of the process gas C to the processing module 3A in the second cycle is subsequently started (the process step PS7 in the second cycle). When the processing modules 3A and 3B are not distinguished from each other (an order thereof does not matter), the recipe RC24 is equivalent to the recipe RC21 of the processing module 3B.

As shown in the recipes RC1 to RC4 of FIG. 7, the start timing of the process step PS1 of using the process gas A in the processing module 3B can be optimally controlled by a set parameter and a predicted sequence.

However, none of the recipes RC1 and RC21 to RC24 in FIG. 7 can be said to be guaranteed that all the gas supply timings do not overlap with each other for any recipe.

Figure 8:
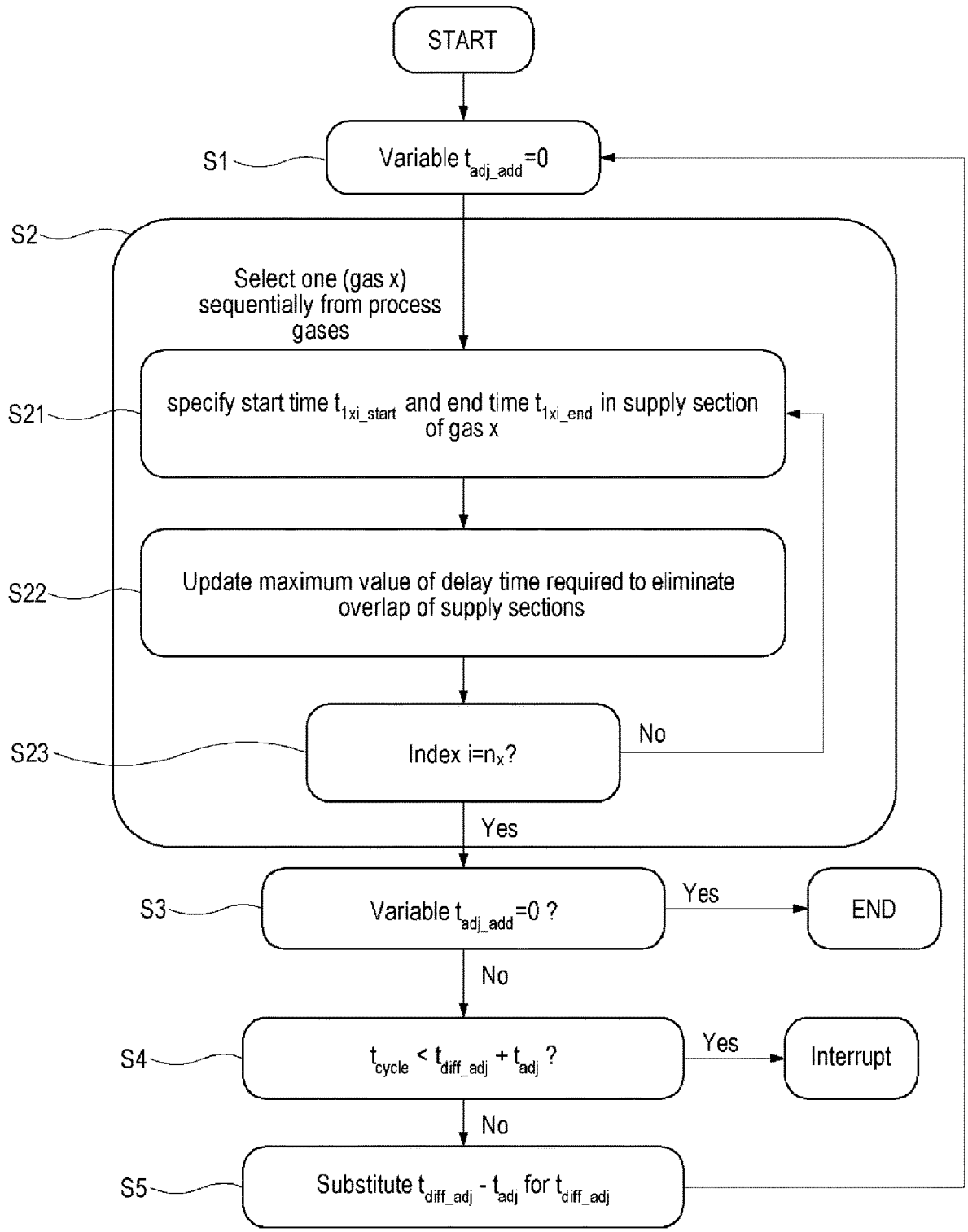
FIG. 8 is a view showing a processing flow for determining a shift amount.

FIG. 8 is a view showing a processing flow for determining an amount of shift in which the supply timings do not overlap with each other. The processing flow of FIG. 8 is to calculate the required amount of shift starting from a state in which a time difference $t_{adj}$ between the cycles of the recipes of the processing modules 3A and 3B is zero.

Step S1: 0 is substituted for a variable $t_{adj\_add}$ indicating the time to delay the recipe of the processing module 3B further than the current time difference $t_{adj}$.

Step S2: The following process (steps S21 to S23) is performed on each of the process gases by sequentially selecting one (gas x) from the process gases.

Step S21: In one specific cycle of the recipe in the processing module 3A, the supply section of the gas x is sequentially selected from the top, and its start time $t_{1xi\_start}$ and its end time $t_{1xi\_end}$ are specified. Where, i is an index of $n_x$ existing supply sections.

Step S22: It is checked whether or not there is supply of gas x which starts between the start time $t_{1xt\_start}$ and the end time $t_{1xi\_end}$ in any one cycle of the recipe in the processing module 3B having a time $t_{adj}$ difference from the processing module 3A, and a maximum value of the delay time required to eliminate overlap of supply sections is updated. Specifically, $t_{2xj\_start}$ satisfying the condition of $t_{1xi\_start} \leq t_{2xj\_start} < t_{1xi\_end}$ is searched from all cycle supply sections $j=1 \ldots n_x$, and if $t_{adj\_add} < t_{2xj\_start} - t_{1xi\_start}$, then $t_{2xj\_start} - t_{xi\_start}$ is substituted for $t_{adj\_add}$.

Step S23: If the index i has not reached $n_x$, the process returns to step S21, and if it has reached $n_x$, the process proceeds to the next step (step S3).

Step S3: If the held variable $t_{adj\_add}$ is zero, the current time difference $t_{adj}$ is determined (that is, $t_{adj}$ is determined as $t_{diff\_adj}$ or $t_{max}$), and the process is ended.

When the variable $t_{adj\_add}$ is non-zero in step S3, if $t_{cycle} < t_{diff\_adj}$ in step S4, the process is interrupted because it is impossible to eliminate the overlap.

If $t_{cycle} \geq t_{diff\_adj} + t_{adj}$ in step S4, $t_{diff\_adj} - t_{adj}$ is substituted for $t_{diff\_adj}$ in step S5, and the process returns to step S1.

The above description is summarized as follows.

A substrate processing apparatus (2) includes:

a first processing module (3A) including a first processing chamber (reaction tube (10A)) for processing a plurality of vertically arranged substrates (W);

a second processing module (3A) including a second processing chamber (reaction tube (10B)) for processing the plurality of vertically arranged substrates, the second processing chamber (10B) being disposed adjacent to the first processing chamber (10A);

a first exhaust box (74A) storing a first exhaust system configured to exhaust the first processing chamber (10A);

a second exhaust box (74B) storing a second exhaust system configured to exhaust the second processing chamber (10B);

a common supply box (72) that controls at least one of a flow path and a flow rate of a plurality of process gases (A, B and C) supplied into the first and second processing chambers (10A and 10B);

a first valve group (40A and 40a to 40f) that connects gas pipes from the common supply box (72) to the first processing chamber (10A) such that a communication state between the gap pipes and the first processing chamber is controllable; and a second valve group (40B and 40a to 40f) that connects the gas pipes from the common supply box to the second processing chamber (10B) such that a communication state between the gas pipes and the second processing chamber.

In the first processing module and the second processing modules (3A and 3B), processes of repeating substantially the same gas supply sequence (recipes RC1 and RC2) are performed in parallel with each other while having a shift time therebetween so as to form the same film.

The shift time is determined by a method (insertion of PSA1 to recipe RC2) of delaying the gas supply sequence (PS7 of recipe RC2) of one (3B) of the processing modules (3A and 3B) so that a supply timing of a predetermined gas among the plurality of process gases (A, B and C) does not overlap with the gas supply sequence (PS7 of recipe RC1) of the other (3A) of the processing modules (3A and 3B) which has started the processing before the one of the processing modules (3A and 3B) starts the processing.

In the substrate processing apparatus (2),

The first and second processing modules (3A and 3B), the first and second exhaust boxes (74A and 74B) and the first and second valve groups (40A and 40B) are respectively configured and arranged in plane symmetry with each other, based on surfaces (S1 and S2) to which the first and second processing modules (3A and 3B) are adjacent.

Lengths of a plurality of gas pipes (10Aa and 10Ab) between the first valve group (40A) and the first processing module (3A) are equal to lengths of the corresponding gas pipes (10Ba and 10Bb) between the second valve group (40B) and the second processing module (3B).

In the substrate processing apparatus (2),

The plurality of process gases includes three types of precursor gases.

The gas supply sequence (recipes RC1 and RC2) is to periodically supply three types of process gases (A, B and C) at time intervals to one processing chamber. While the gas supply sequence is being performed in parallel in the first and second processing modules (3A and 3B), there is a timing (in FIG. 6B, PS2 and PS3 of RC1, PSA1 of RC2, PS5 and PS6 of RC1, and PS2 and PS3 of RC2) at which each of the three types of process gases (A, B and C) is not supplied to any of the first and second processing modules (3A and 3B).

The substrate processing apparatus (2) further includes:

a first process controller (controller 100(A)) that controls the first processing module (3A), the first exhaust box (74A) and the first valve group (40A); and a second process controller (controller 100 (B)) that controls the second processing module (3B), the second exhaust box (74B) and the second valve group (40B).

The first and second process controllers (100 (A) and 100 (B)) transmit information substantially indicating circulation states of the first and second valve groups (40A and 40B) controlled respectively by the first and second process controllers (100 (A) and 100 (B)) to other process controllers (100 (A) and 100 (B)), and the first and second processing modules (3A and 3B) are operated asynchronously except while prohibiting simultaneous supply of the same gas valve by the first and second valve groups (40A and 40B).

(Modifications)

Several modifications will be described below.

(First Modification)

Figure 9:
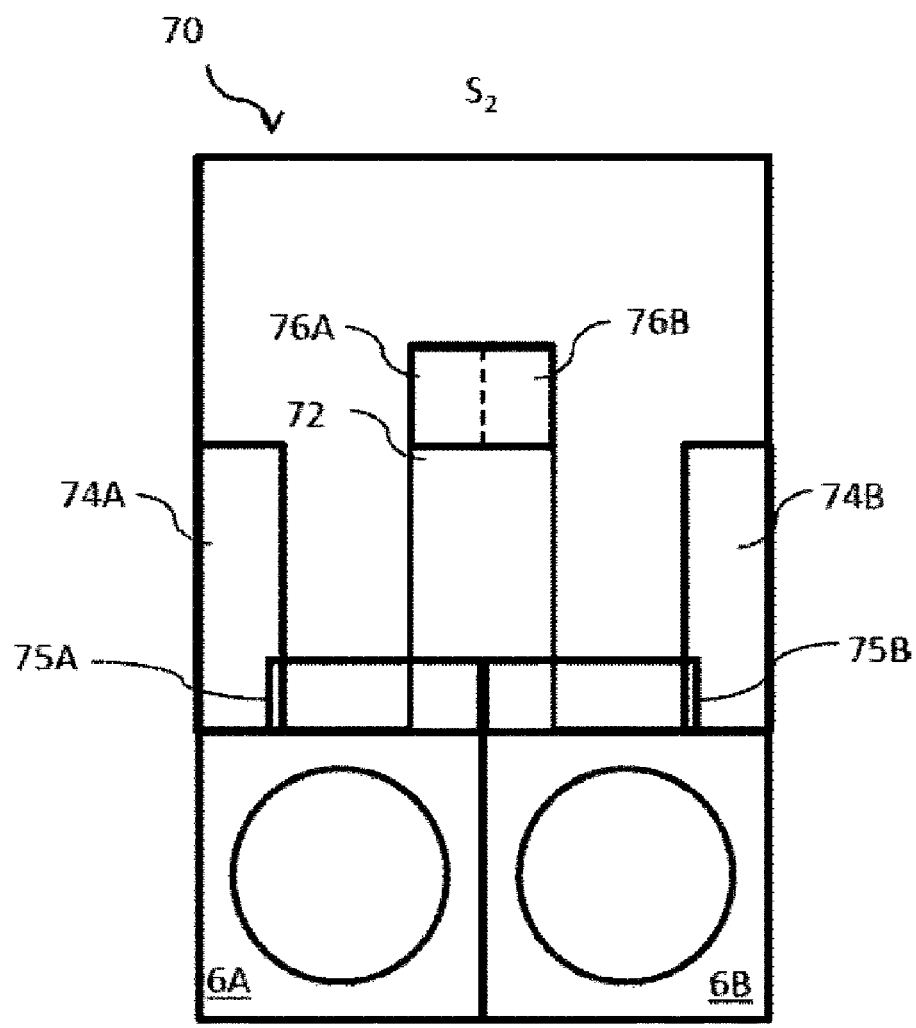
FIG. 9 is a top view schematically illustrating an example of a substrate processing apparatus according to a first modification.

FIG. 9 is a top view schematically showing an example of a substrate processing apparatus according to a first modification of the present disclosure.

As shown in FIG. 9, a utility system 70 is constituted by a supply box 72, exhaust boxes 74A and 74B and controller boxes 76A and 76B. The supply box 72, the exhaust boxes 74A and 74B and the controller boxes 76A and 76B are arranged in plane symmetry with respect to the adjacent surface $S_2$ of the transfer chambers 6A and 6B. The exhaust box 74A is disposed at an outer corner of the back surface of the transfer chamber 6A opposite to the transfer chamber 6B. The exhaust box 74B is disposed at an outer corner of the back surface of the transfer chamber 6B opposite to the transfer chamber 6A. That is, the exhaust boxes 74A and 74B are installed flat (smoothly) so that the outer side surfaces of the transfer chambers 6A and 6B and the outer side surfaces of the exhaust boxes 74A and 74B are connected in a plane.

The supply box 72 is centrally located between the exhaust boxes 74A and 74B, spaced apart from the exhaust boxes 74A and 74B. The front surface of the supply box 72 is disposed in contact with the back surfaces of the transfer chamber 6A and 6B. The final valve installation parts 75A and 75B are installed in contact with the back surfaces of the process furnaces 4A and 4B. The contacting portion of the side surfaces of the final valve installation parts 75A and 75B is provided on the upper side of the front surface of the supply box 72. A plurality of pipes are arranged from the supply box 72 to the final valve installation parts 75A and 75B at the overlapping portions of the final valve installation parts 75A and 75B and the supply box 72. The controller boxes 76A and 76B are provided in contact with the back surface of the supply box 72.

Even with such a configuration, similarly to the one described in FIG. 5, an arrival time when a gas is supplied from the supply box 72 to the nozzle 44a of the processing module 3A via the valve 40a and the pipe 10Aa of the processing module 3A may be the same as an arrival time when the same gas is supplied from the supply box 72 to the nozzle 44a of the processing module 3B via the valve 40a and the pipe 10Ba of the processing module 3B.

(Second Modification)

Figure 10:
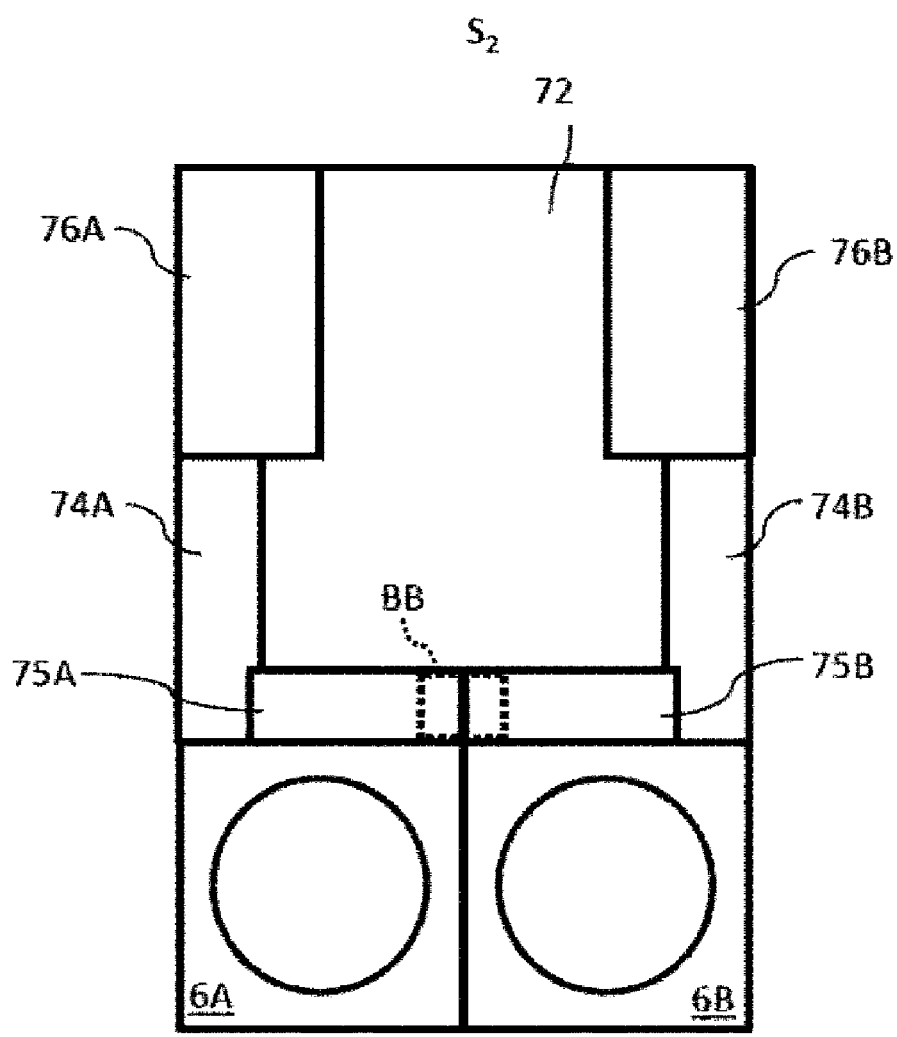
FIG. 10 is a top view schematically showing an example of a substrate processing apparatus according to a second modification.

FIG. 10 is a top view schematically showing an example of a substrate processing apparatus according to a second modification of the present disclosure. FIG. 10 differs from FIG. 9 in that the controller boxes 76A and 76B are provided at the back surfaces of the exhaust boxes 74A and 74B and the supply box 72 is provided at the entire floor surface. The other configurations are the same as those in FIG. 10. A plurality of pipes from the supply box 72 to the final valve installation parts 75A and 75B can be arranged at a position indicated by a dotted rectangular line BB.

Even with such a configuration, similarly to the one described in FIG. 5, an arrival time when a gas is supplied from the supply box 72 to the nozzle 44a of the processing module 3A via the valve 40a and the pipe 10Aa of the processing module 3A may be the same as an arrival time when the same gas is supplied from the supply box 72 to the nozzle 44a of the processing module 3B via the valve 40a and the pipe 10Ba of the processing module 3B.

(Third Modification)

Figure 11:
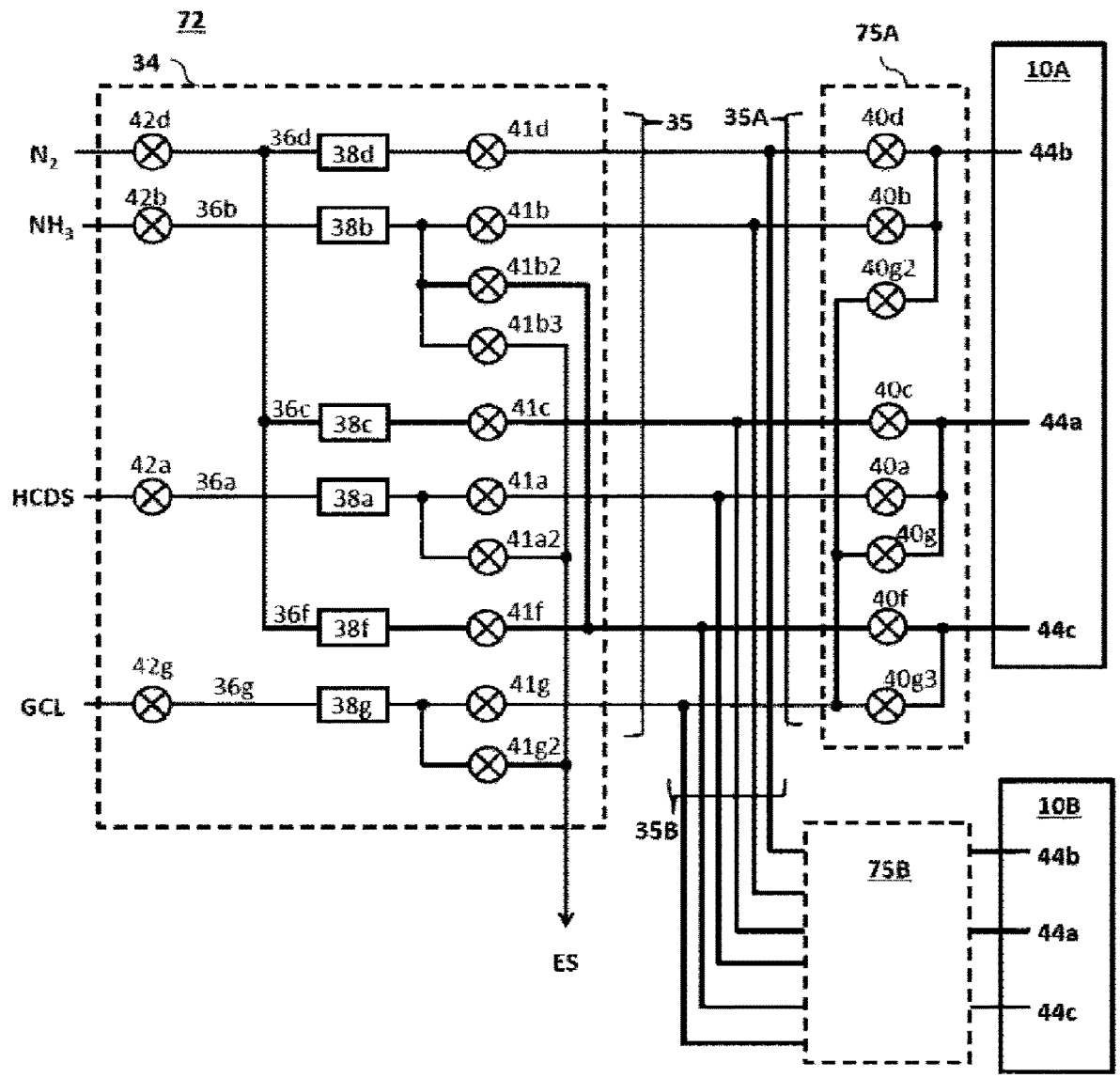
FIG. 11 is a view showing a gas supply system according to a third modification.

FIG. 11 is a view showing a gas supply system according to a third modification of the present disclosure.

FIG. 11 illustrates a gas supply system 34 for supplying a nitrogen gas ($N_2$), an ammonia gas ($NH_3$), an HCDS gas and a cleaning gas (GCL). The final valve installation part 75A has the same configuration as the final valve installation part 75B, and, explanation of the configuration of the final valve installation part 75B will not be repeated.

The HCDS gas can be supplied to the nozzle 44a of the reaction tubes 10A and 10B via the valve 42a, the MFC 38a, the valve 41a, and the valve 40a of the final valve installation parts 75A and 75B.

The ammonia gas ($NH_3$) can be supplied to the nozzle 44b of the reaction tubes 10A and 10B via the valve 42b, the MFC 38b, the valve 41b, and the valve 40b of the final valve installation parts 75A and 75B. The ammonia gas ($NH_3$) can also be supplied to the nozzle 44c of the reaction tubes 10A and 10B via the valve 41b2, and the valve 40f of the final valve installation parts 75A and 75B.

The nitrogen gas ($N_2$) can be supplied to the nozzle 44a of the reaction tubes 10A and 10B via the valve 42d, the MFC 38c, the valve 41c, and the valve 40c of the final valve installation parts 75A and 75B. The nitrogen gas ($N_2$) can also be supplied to the nozzle 44b of the reaction tubes 10A and 10B via the valve 42d, the MFC 38d, the valve 41d, and the valve 40d of the final valve installation parts 75A and 75B. Further, the nitrogen gas ($N_2$) can be supplied to the nozzle 44c of the reaction tubes 10A and 10B via the valve 42d, the MFC 38f, the valve 41f, and the valve 40f of the final valve installation parts 75A and 75B.

The cleaning gas GCL can be supplied to all the nozzles 44a, 40b and 40c of the reaction tubes 10A and 10B via the valve 42g, the MFC 38g, the valve 41g, and the valves 40g, 40g2 and 40g3 of the final valve installation parts 75A and 75B.

Further, the valve 41a2 at the downstream of the MFC 38c, the valve 41b3 at the downstream of the MFC 38b, and the valve 41g2 at the downstream of the MFC 38b are connected to an exhaust system ES.

As shown in FIG. 11, a plurality of gas pipes 35, which are distribution pipes on the downstream side of the gas supply system 34, are branched into a plurality of gas distribution pipes 35A connected to the final valve installation part 75A and a plurality of gas pipes 35B connected to the final valve installation part 75B. The plurality of gas distribution pipes 35A and the plurality of gas pipes 35B have the same length. The plurality of gas pipes 35 may be appropriately provided with a heater, a filter, a check valve, a buffer tank and the like.

The valves 40a to 40d, 40f, 40g, 40g2 and 40g3, which are a final valve group of the processing module 3A, are provided in front of three nozzles (also referred to as injectors) 44a, 44b and 44c of the reaction tube 10A of the processing module 3A. Supply of gas to the injectors can be directly operated by the controller 100. The final valve group (the valves 40a to 40d, 40f, 40g, 40g2 and 40g3) of FIG. 11 can supply a plurality of gases simultaneously (that is, in mixture) to one injector 44a, 44b or 44c. In addition, the cleaning gas GCL from one distribution pipe can be supplied to all the injectors 44a, 44b and 44c. The valves 40a to 40d, 40f, 40g, 40g2 and 40g3, which are a final valve group of the processing module 3B, have the same configuration as the final valve group (the valves 40a to 40d, 40f, 40g, 40g2, 40g3) of the processing module 3A.

According to the present embodiments, one or more of the following effects can be obtained.

1) Qualities of films formed among a plurality of processing modules 3A and 3B may be made uniform.

2) Heat histories may be made equal among the plurality of processing modules 3A and 3B.

3) Since a common supply box is provided for the plurality of processing modules 3A and 3B and gas pipes from the supply box to the final valves are shared, it is possible to save a space of the substrate processing apparatus.

4) By the above item 3), the footprint required by the substrate processing apparatus 2 is lowered, and it is possible to reduce a use area of a clean room with respect to the required amount of production, which is very advantageous in terms of economy.

Although an example of using the HCDS gas as a precursor gas has been illustrated in the above embodiments, the present disclosure is not limited thereto. For example, in addition to the HCDS gas, it may be possible to use, as the precursor gas, an inorganic halosilane precursor gas such as a DCS ($Si_2H_4Cl_6$: dichlorodisilane) gas, an MCS ($SiH_3Cl$: monochlorosilane) gas or a TCS ($SiHCl_3$: trichlorosilane) gas, a halogen group-non-containing amino-based (amine-based) silane precursor gas such as a 3DMAS (S [$N(CH_3)_2]_3H$: tris-dimethyl-amino-silane) gas or a BTBAS ($SiH_2[NH(C_4H_9)]_2$: bis-tertiary-butyl-amino-silane) gas, or a halogen group-non-containing inorganic silane precursor gas such as an MS ($SiH_4$: monosilane) gas or a DS ($Si_2H_6$: disilane) gas.

Although an example of forming a SiN film has been illustrated in the above embodiments, the present disclosure is not limited thereto. For example, in addition to the SiN film, it may be possible to form a $SiO_2$ film, a SiON film, a SiOCN film, a SiOC film, a SiCN film, a SiBN film, a SiBCN film or the like using a nitrogen (N)-containing gas (nitriding gas) such as an ammonia ($NH_3$) gas, a carbon (C)-containing gas such as a propylene ($C_3H_6$) gas, a boron (B)-containing gas such as a boron trichloride ($BCl_3$) gas, or the like. Even when these films are formed, the film formation can be performed under the same processing conditions as the above embodiments, and the same effects as the above embodiments can be obtained.

Although an example of depositing a film on a wafer W has been illustrated in the above embodiments, the present disclosure is not limited thereto. For example, the present disclosure can also be suitably applied to a case where a wafer W or a film formed on the wafer W is subjected to a process such as oxidation, diffusion, annealing, etching or the like.

Although the present disclosure made by the present inventors has been concretely described by way of examples, the present disclosure is not limited to the above embodiments and examples, but may be changed and modified in different ways.

For example, it is also possible to arrange reaction chambers of three or more processing modules for one gas supply device and supply a gas through supply pipes having the same length. In addition, it is to be understood by those skilled in the art that the present disclosure can be easily applied to an apparatus that executes two equal-time recipes sharing not all but some (for example, Si precursor gas) of gases used in parallel with a predetermined time difference.

According to the present disclosure in some embodiments, it is possible to obtain uniform qualities for films formed by first and second processing modules.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus comprising:
   a first processing module including a first processing chamber for processing a plurality of vertically arranged substrates;
   a second processing module including a second processing chamber for processing the plurality of vertically arranged substrates, the second processing chamber being disposed adjacent to the first processing chamber;
   a first exhaust box containing a first exhaust system configured to exhaust the first processing chamber;
   a second exhaust box containing a second exhaust system configured to exhaust the second processing chamber;
   a common supply box configured to control at least one of a flow path and a flow rate of a plurality of process gases supplied into the first processing chamber and the second processing chamber;
   a first valve group that connects gas pipes from the common supply box to the first processing chamber such that a communication state between the gas pipes and the first processing chamber is controllable; and
   a second valve group that connects the gas pipes from the common supply box to the second processing chamber such that a communication state between the gas pipes and the second processing chamber is controllable,
   wherein, in the first processing module and the second processing module, processes of repeating substantially the same gas supply sequence are performed in parallel with each other while having a shift time therebetween so as to form a same film, and
   wherein the shift time is determined by a method of delaying the gas supply sequence of one of the first processing module and the second processing module so that a supply timing of a predetermined gas among the plurality of process gases does not overlap with the gas supply sequence of the other of the first processing module and the second processing module which has started the processing before the one of the first processing module and the second processing module starts the processing.

2. The substrate processing apparatus of claim 1, wherein the first processing module and the second processing module, the first exhaust box and the second exhaust box, and the first valve group and the second valve group are respectively configured and arranged in plane symmetry with each other, based on surfaces to which the first processing module and the second processing module are adjacent, and
   wherein lengths of a plurality of gas distribution pipes between the first valve group and the first processing module are equal to lengths of the corresponding gas distribution pipes between the second valve group and the second processing module.

3. The substrate processing apparatus of claim 1, wherein the plurality of process gases includes three types of precursor gases,
   wherein the gas supply sequence is to periodically supply the three types of precursor gases at time intervals to one processing chamber, and
   wherein, while the gas supply sequence is being performed in parallel in the first processing module and the second processing module, there is a timing at which each of the three types of precursor gases is not supplied to any of the first processing chamber and the second processing chamber.

4. The substrate processing apparatus of claim 2, further comprising:
   a first process controller configured to control the first processing module, the first exhaust box, and the first valve group; and
   a second process controller configured to control the second processing module, the second exhaust box, and the second valve group,
   wherein the first process controller and the second process controller transmit information substantially indicating circulation states of the first valve group and the second valve group controlled respectively by the first process controller and the second process controller to other process controllers, and
   wherein the first processing module and the second processing module are operated asynchronously except while prohibiting simultaneous supply of the same gas valve by the first valve group and the second valve group.

5. The substrate processing apparatus of claim 1, wherein the plurality of process gases includes three types of precursor gases,
   wherein the gas supply sequence is to periodically supply the three types of precursor gases at time intervals to one processing chamber, and
   wherein, in the gas supply sequence, an exhaust by the first exhaust system or the second exhaust system is performed at least for the time intervals.

6. The substrate processing apparatus of claim 5, wherein the exhaust includes an exhaust process in which the exhaust by the first exhaust system or the second exhaust system is performed, and a purge process in which the exhaust by the first exhaust system or the second exhaust system is performed while flowing a purge gas after the exhaust process.

7. The substrate processing apparatus of claim 5, wherein the shift time is the same as the longest supply time of the precursor gas among the three types of precursor gases in the gas supply sequence.

8. The substrate processing apparatus of claim 5, wherein the shift time is further limited based on a rule that exhaust timings of a first gas and a second gas included in the three types of precursor gases of the first processing module do not overlap with exhaust timings of the first gas and the second gas of the second processing module.

9. The substrate processing apparatus of claim 5, wherein the shift time is further limited based on a rule that an end of a purge process of a first gas included in the three types of precursor gases and an exhaust process of a second gas included in the three types of precursor gases of the first processing module do not overlap with an end of a purge process of the first gas and an exhaust process of the second gas of the second processing module.

10. A method of manufacturing a semiconductor device, comprising:
   providing the substrate processing apparatus of claim 1;
   loading the plurality of substrates into the first processing chamber;
   loading the plurality of substrates into the second processing chamber; and
   performing the processes of forming the same film in the first processing module and the second processing module in parallel with each other while having the shift time therebetween.

\* \* \* \* \*